(12) United States Patent
Han

(10) Patent No.: US 11,600,726 B2
(45) Date of Patent: Mar. 7, 2023

(54) SEMICONDUCTOR STRUCTURE

(71) Applicant: CHANGXIN MEMORY TECHNOLOGIES, INC., Hefei (CN)

(72) Inventor: Qinghua Han, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/648,732

(22) Filed: Jan. 24, 2022

(65) Prior Publication Data
US 2023/0006061 A1     Jan. 5, 2023

Related U.S. Application Data

(63) Continuation of application No. PCT/CN2021/121617, filed on Sep. 29, 2021.

(30) Foreign Application Priority Data

Jul. 1, 2021  (CN) .......................... 202110746050.4

(51) Int. Cl.
*H01L 29/78*     (2006.01)
*H01L 29/423*    (2006.01)
(Continued)

(52) U.S. Cl.
CPC .... *H01L 29/7827* (2013.01); *H01L 27/10814* (2013.01); *H01L 27/10891* (2013.01); *H01L 29/42392* (2013.01); *H01L 29/66666* (2013.01)

(58) Field of Classification Search
CPC ........... H01L 29/7827; H01L 27/10814; H01L 27/10891; H01L 29/42392; H01L 29/66666
(Continued)

(56) References Cited

U.S. PATENT DOCUMENTS 5,627,390 A * 5/1997 Maeda ............. H01L 27/10823
                                                257/302
5,990,509 A    11/1999 Burns, Jr. et al.
(Continued)

FOREIGN PATENT DOCUMENTS

CN     101572258 A    11/2009
CN     101908553 A    12/2010
(Continued)

OTHER PUBLICATIONS

International Search Report and English Translation cited in PCT/CN2021/121617 dated Mar. 3, 2022, 9 pages.
(Continued)

*Primary Examiner* — Mohammad M Hoque
(74) *Attorney, Agent, or Firm* — Cooper Legal Group, LLC

(57) ABSTRACT

Embodiments of the present disclosure provide a semiconductor structure and a manufacturing method thereof. The semiconductor structure includes: a base; bit lines, located on the base, and a material of the bit line including a metal semiconductor compound; semiconductor channels, each including a first doped region, a channel region and a second doped region arranged in sequence, and the first doped region being in contact with the bit line; a first dielectric layer, covering sidewall surfaces of the first doped regions, and a first interval being provided between parts of the first dielectric layer covering sidewalls of adjacent first doped regions on a same bit line; an insulating layer, covering sidewall surfaces of the channel regions; word lines, covering a sidewall surface of the insulating layer away from the channel regions, and a second interval being provided between adjacent word lines.

11 Claims, 22 Drawing Sheets

(51) Int. Cl.
*H01L 27/108* (2006.01)
*H01L 29/66* (2006.01)

(58) Field of Classification Search
USPC ........................................................ 257/329
See application file for complete search history.

(56) References Cited

U.S. PATENT DOCUMENTS

| | | | |
|---|---|---|---|
| 7,968,876 B2 | 6/2011 | Lung et al. | |
| 10,361,206 B2 | 7/2019 | Moon et al. | |
| 10,629,615 B1 | 4/2020 | Hu et al. | |
| 2006/0113587 A1 | 6/2006 | Thies et al. | |
| 2007/0051994 A1 | 3/2007 | Song et al. | |
| 2009/0273088 A1 | 11/2009 | Chung et al. | |
| 2010/0052029 A1 | 3/2010 | Huang | |
| 2010/0295123 A1* | 11/2010 | Lung | H01L 27/2463 257/334 |
| 2012/0052674 A1* | 3/2012 | Lee | H01L 27/11582 257/E21.645 |
| 2012/0064704 A1 | 3/2012 | Kim | |
| 2012/0080725 A1 | 4/2012 | Manos et al. | |
| 2012/0119286 A1 | 5/2012 | Kim et al. | |
| 2012/0156844 A1 | 6/2012 | Kim et al. | |
| 2013/0037879 A1* | 2/2013 | Filippini | H01L 27/1027 257/330 |
| 2013/0161710 A1 | 6/2013 | Ji et al. | |
| 2013/0323920 A1 | 12/2013 | Chang et al. | |
| 2015/0348976 A1* | 12/2015 | Moon | H01L 29/105 438/270 |
| 2016/0013292 A1* | 1/2016 | Choi | H01L 45/06 257/329 |
| 2016/0284712 A1* | 9/2016 | Liaw | H01L 29/66666 |
| 2019/0074363 A1 | 3/2019 | Zhu | |
| 2020/0258895 A1 | 8/2020 | Xiao et al. | |
| 2021/0028174 A1 | 1/2021 | Lee | |
| 2021/0066319 A1 | 3/2021 | Chang et al. | |

FOREIGN PATENT DOCUMENTS

| | | |
|---|---|---|
| CN | 102543847 A | 7/2012 |
| CN | 103311249 A | 9/2013 |
| CN | 103311249 B | 5/2017 |
| CN | 108461496 A | 8/2018 |
| CN | 108493188 A | 9/2018 |
| CN | 208127209 U | 11/2018 |
| CN | 109461738 A | 3/2019 |
| CN | 208655642 U | 3/2019 |
| CN | 110957319 A | 4/2020 |
| CN | 111354738 A | 6/2020 |
| CN | 111415945 A | 7/2020 |
| CN | 211719592 U | 10/2020 |
| CN | 112447734 A | 3/2021 |
| KR | 1020070047572 A | 5/2007 |
| KR | 20090132298 A | 12/2009 |
| TW | 201919155 A | 5/2019 |

OTHER PUBLICATIONS

Written Opinion and English Translation cited in PCT/CN2021/121617 dated Mar. 3, 2022, 6 pages.
International Search Report cited in PCT/CN2022/076372 dated Apr. 28, 2022, 8 pages.
International Search Report cited in PCT/CN2021/128087 dated Mar. 28, 2022, 9 pages.
International Search Report cited in PCT/CN2021/117284 dated Mar. 29, 2022, 9 pages.
Supplementary European Search Report cited in EP21884120 dated Dec. 8, 2022, 8 pages.
Supplementary European Search Report cited in EP21870544 dated Dec. 13, 2022, 7 pages.
Taiwan Office Action cited in TW 111121996, dated Nov. 18, 2022, 4 pages.

* cited by examiner

SEMICONDUCTOR STRUCTURE

CROSS-REFERENCE TO RELATED APPLICATIONS

This is a continuation of International Application No. PCT/CN2021/121617, filed on Sep. 29, 2021, which claims the priority to Chinese Patent Application 202110746050.4, titled "SEMICONDUCTOR STRUCTURE AND MANUFACTURING METHOD THEREOF" and filed with the China National Intellectual Property Administration (CNIPA) on Jul. 1, 2021. The entire contents of International Application No. PCT/CN2021/121617 and Chinese Patent Application 202110746050.4 are incorporated herein by reference.

TECHNICAL FIELD

The present disclosure relates to, but is not limited to, a semiconductor structure and a manufacturing method thereof.

BACKGROUND

With the increasing integration density of the dynamic memory, it is also necessary to consider how to improve the electrical performance of small-sized functional devices when studying the arrangement of transistors and the way to reduce the size of individual functional devices in the dynamic memory array structure.

When vertical gate-all-around (GAA) transistors are used as access transistors of the dynamic memory, the area occupied by the GAA transistors can reach 4F2 (F: the smallest pattern size available under given process conditions). In principle, this arrangement can improve the density and efficiency, but the bit lines buried at the bottom of the transistors may cause a large resistance in some sizes because their main component is silicon.

SUMMARY

An overview of the subject matter detailed in the present disclosure is provided below, which is not intended to limit the protection scope of the claims.

An embodiment of the present disclosure provides a semiconductor structure. The semiconductor structure includes: a base; bit lines, located on the base, and a material of the bit line including a metal semiconductor compound; semiconductor channels, located on surfaces of the bit lines, along a direction that the base points to the bit line, the semiconductor channel including a first doped region, a channel region and a second doped region arranged in sequence, and the first doped region being in contact with the bit line; a first dielectric layer, covering sidewall surfaces of the first doped regions, and a first interval being provided between parts of the first dielectric layer covering sidewalls of adjacent first doped regions on a same bit line; an insulating layer, covering sidewall surfaces of the channel regions; word lines, covering a sidewall surface of the insulating layer away from the channel regions, and a second interval being provided between adjacent word lines; a second dielectric layer, covering sidewall surfaces of the second doped regions, and a third interval being provided between parts of the second dielectric layer located on sidewalls of adjacent second doped regions; and a third dielectric layer, located in the first intervals, the second intervals and the third intervals.

Correspondingly, an embodiment of the present disclosure further provides a method of manufacturing a semiconductor structure, including: providing a base; forming initial bit lines on the base, and forming semiconductor channels on surfaces of the initial bit lines away from the base, along a direction that the base points to the initial bit line, the semiconductor channel including a first doped region, a channel region and a second doped region arranged in sequence; forming a first dielectric layer covering sidewall surfaces of the first doped regions, and a first interval being provided between parts of the first dielectric layer covering sidewalls of adjacent first doped regions on a same initial bit line; forming an insulating layer covering sidewall surfaces of the channel regions; forming word lines covering a sidewall surface of the insulating layer away from the channel regions, and a second interval being provided between adjacent word lines; forming a second dielectric layer covering sidewall surfaces of the second doped regions, and a third interval being provided between parts of the second dielectric layer located on sidewalls of adjacent second doped regions; and the first interval, the second interval and the third interval connecting and exposing a part of the initial bit line; and metalizing the part of the initial bit line exposed, to form a bit line, and a material of the bit line including a metal semiconductor compound.

Other aspects of the present disclosure are understandable upon reading and understanding of the drawings and detailed description.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these drawings, similar reference numerals are used to represent similar elements. The drawings in the following description are part rather than all of the embodiments of the present disclosure. Those skilled in the art may derive other drawings based on these drawings without creative efforts.

One or more embodiments are exemplified by corresponding drawings, and these exemplified descriptions do not constitute a limitation on the embodiments. Components with the same reference numerals in the drawings are denoted as similar components, and the drawings are not limited by scale unless otherwise specified.

DETAILED DESCRIPTION

As mentioned in the background, at present, it is necessary to improve the electrical performance of small-sized functional devices in the semiconductor structure while increasing the integration density of the semiconductor structure.

Embodiments of the present disclosure provide a semiconductor structure and a manufacturing method thereof. In the semiconductor structure, vertical GAA transistors are provided on a base, and bit lines are located between the base and the GAA transistors, thereby forming a three-dimensional (3D) stacked semiconductor structure, which increases the integration density of the semiconductor structure. In addition, since a material of the bit lines includes a metal semiconductor compound, the resistance of the bit lines is reduced to improve the electrical performance of the semiconductor structure.

The embodiments of the present disclosure are described in detail below with reference to the drawings. Those skilled in the art should understand that many technical details are proposed in the embodiments of the present disclosure to make the present disclosure better understood. However, even without these technical details and various changes and modifications made based on the following embodiments, the technical solutions claimed in the present disclosure may still be realized.

Figure 1:
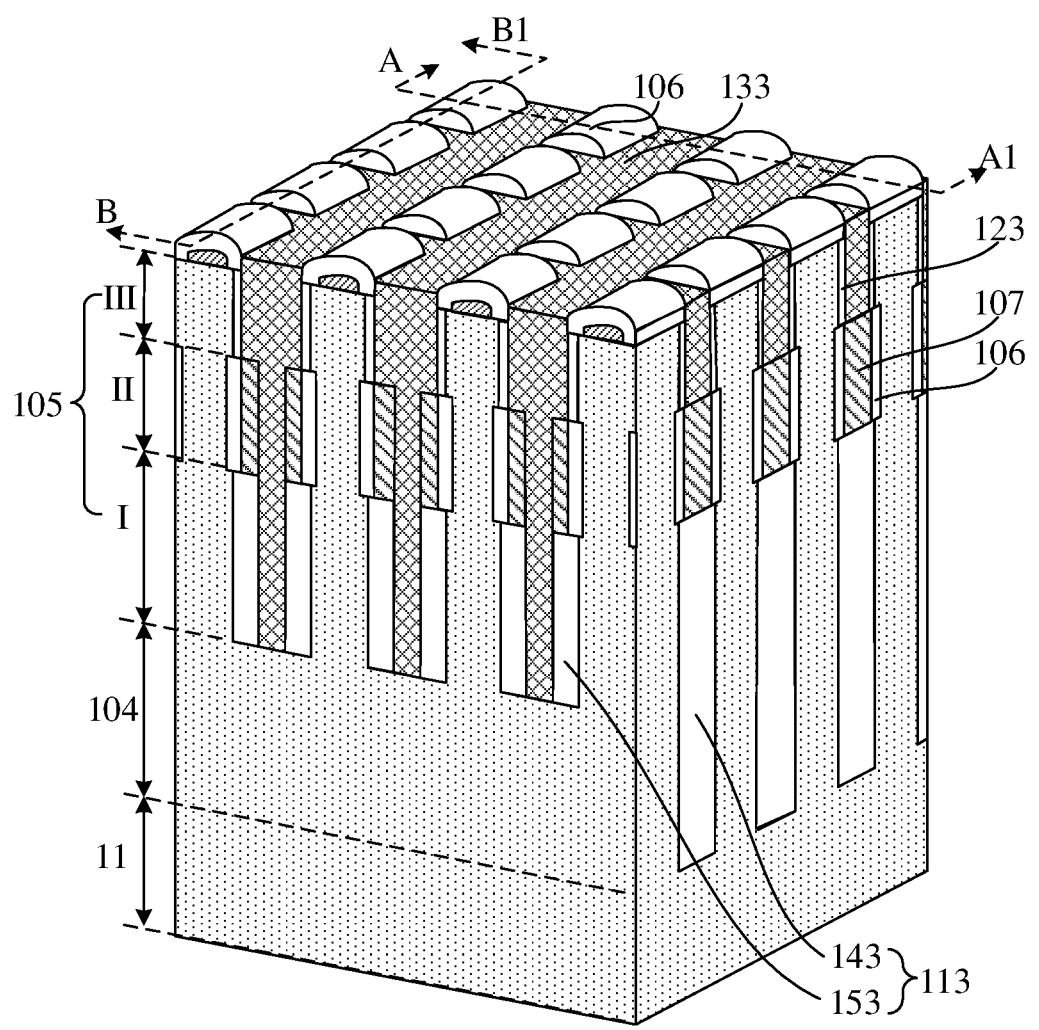
FIGS. 1 to 35 are schematic diagrams of a semiconductor structure corresponding to steps of a method of manufacturing a semiconductor structure according to an embodiment of the present disclosure.
Figure 2:
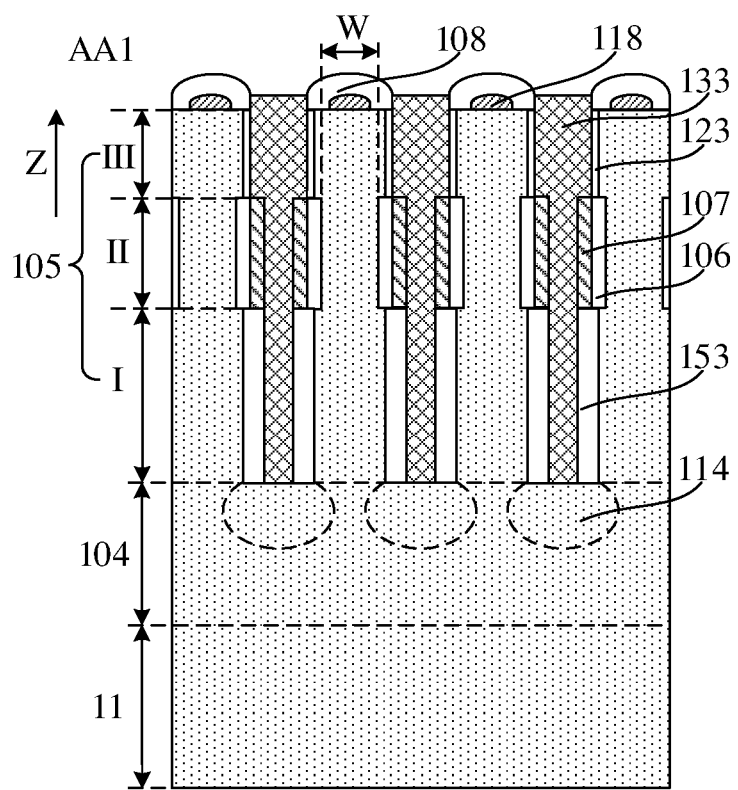
Figure 3:
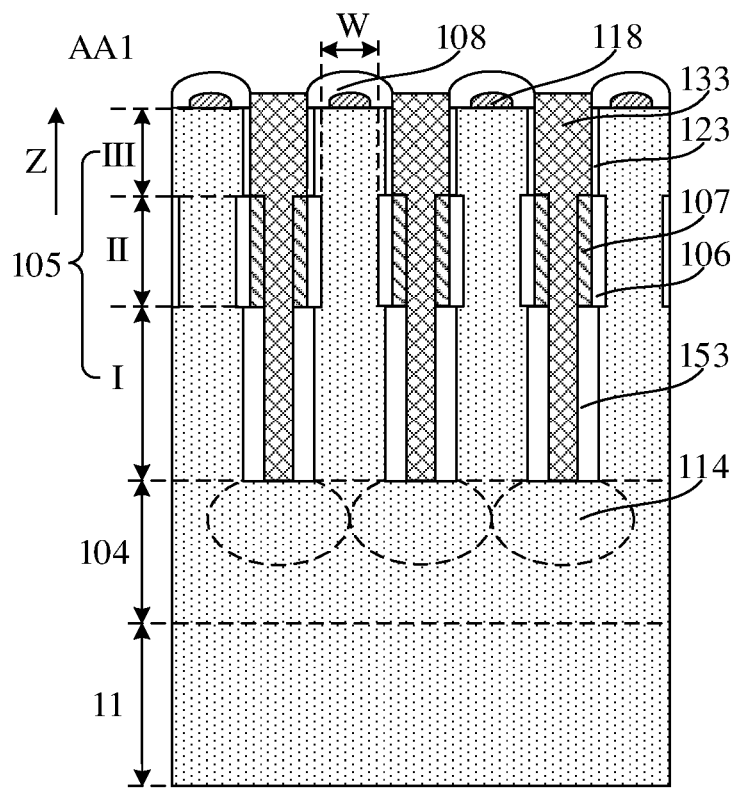
Figure 4:
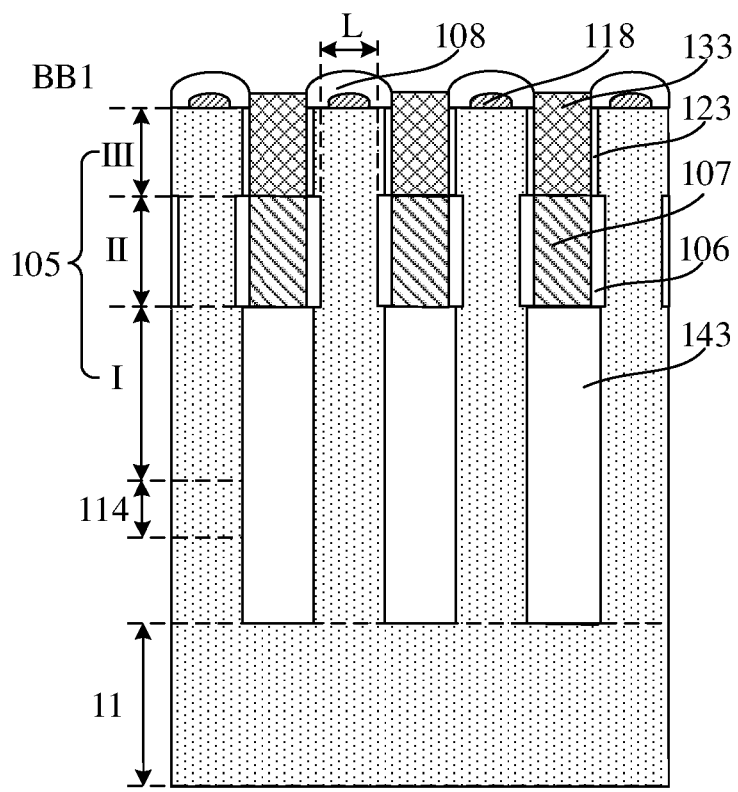
Figure 5:
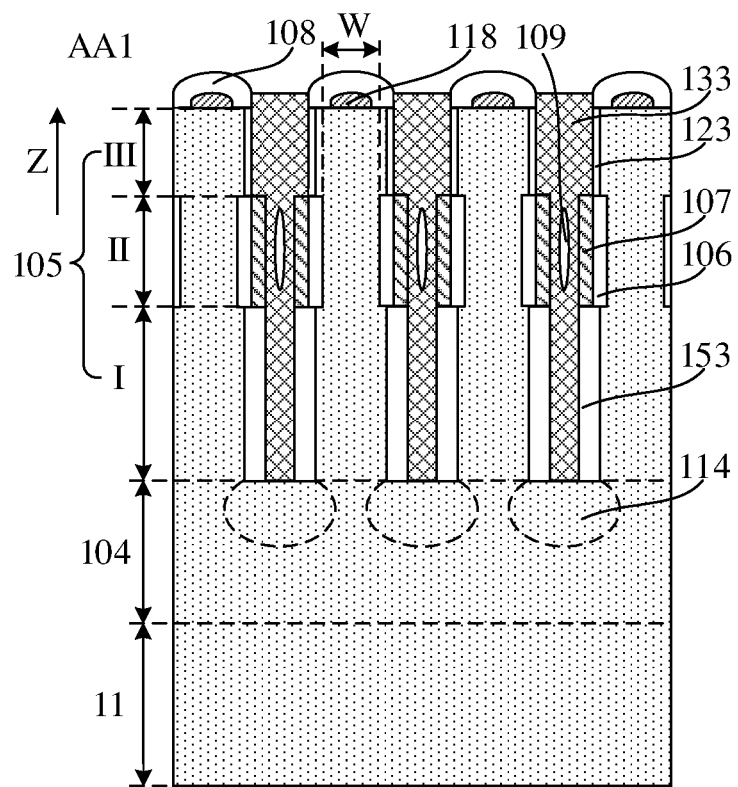

An embodiment of the present disclosure provides a semiconductor structure. The semiconductor structure provided by the embodiment of the present disclosure is described in detail below with reference to the drawings. FIGS. 1 to 5 are schematic structural diagrams of the semiconductor structure according to the embodiment of the present disclosure. FIG. 1 is a schematic structural diagram of the semiconductor structure according to the embodiment of the present disclosure; FIG. 2 is a schematic sectional diagram of the structure shown in FIG. 1 along a first sectional direction AA1; FIG. 3 is another schematic sectional diagram of the structure shown in FIG. 1 along the first sectional direction AA1; FIG. 4 is a schematic sectional diagram of the structure shown in FIG. 1 along a second sectional direction BB1; and FIG. 5 is another schematic structural diagram of the semiconductor structure according to the embodiment of the present disclosure.

Referring to FIGS. 1 to 5, the semiconductor structure includes: a base 11; bit lines 104, located on the base 11, and a material of the bit line 104 including a metal semiconductor compound; semiconductor channels 105, located on surfaces of the bit lines 104, the semiconductor channel 105 including a first doped region I, a channel region II, and a second doped region III arranged in sequence along a direction Z that the base 11 points to the bit line 104, and the first doped region I being in contact with a bit line 104; a first dielectric layer 113, covering sidewall surfaces of the first doped regions I, a first interval is provided between parts of the first dielectric layer 113 covering sidewalls of adjacent first doped regions I on the same bit line 104; an insulating layer 106, covering sidewall surfaces of channel regions II; word lines 107, covering sidewall surface of the insulating layer 106 away from the channel regions II, and a second interval being provided between adjacent word lines 107; a second dielectric layer 123, covering sidewall surfaces of the second doped regions II, a third interval is provided between parts of the second dielectric layer 123 located on sidewalls of adjacent second doped regions II; and a third dielectric layer 133, located in first intervals, second intervals and third intervals.

The semiconductor structure is provided with vertical GAA transistors, and the bit lines 104 are located between the base 11 and the GAA transistors, thereby forming a 3D stacked semiconductor structure, which increases the integration density of the semiconductor structure The semiconductor structure is described in more detail below with reference to FIGS. 1 to 5

In this embodiment, a material of the base 11 may be an elemental semiconductor material or a crystalline inorganic compound semiconductor material. The elemental semiconductor material may be silicon or germanium, and the crystalline inorganic compound semiconductor material may be silicon carbide, silicon germanium, gallium arsenide or indium gallium. In addition, the base 11 is doped with a first type of ion.

In some embodiments of the present disclosure, the base 11, the bit lines 104 and the semiconductor channels 105 include the same semiconductor element, so the semiconductor channels 105 and the bit lines 104 may be formed by using the same film structure. The film structure is composed of the semiconductor element, such that the semiconductor channels 105 and the bit lines 104 are integrated, thereby avoiding interface state defects between the semiconductor channel 105 and the bit line 104 and improving the performance of the semiconductor structure.

The semiconductor element may include at least one of silicon, carbon, germanium, arsenic, gallium or indium. In an example, both the bit lines 104 and the semiconductor channels 105 include silicon. In other examples, both the bit lines and the semiconductor channels may include germanium. Alternatively, both the bit lines and the semiconductor channels include silicon and germanium. Alternatively, both the bit lines and the semiconductor channels include silicon and carbon. Alternatively, both the bit lines and the semiconductor channels include arsenic and gallium. Alternatively, both the bit lines and the semiconductor channels include gallium and indium.

A material of the bit line 104 includes a metal semiconductor compound 114. The metal semiconductor compound 114 has a smaller resistivity compared with a non-metalized semiconductor material. Therefore, compared with the semiconductor channel 105, the bit line 104 has a smaller resistivity. This reduces the resistance of the bit line 104 and the contact resistance between the bit line 104 and the first doped region I, thereby further improving the electrical performance of the semiconductor structure. In addition, the resistivity of the bit line 104 is also less than that of the base 11.

In some examples, a region of the bit line 104 directly below the first doped region I is made of a semiconductor material, and a region of the bit line 104 not covered by the first doped region I is made of a metal semiconductor compound. As the size of the device continues to shrink and the manufacturing process parameters are adjusted, a part of a region of the bit line 104 directly below the first doped region I is made of a semiconductor material, and the remaining part of the region of the bit line 104 directly below the first doped region I may also be made of a metal semiconductor compound. The "remaining part of the region" here is located on a periphery of the "a part of a region".

In an example, referring to FIG. 2, multiple metal semiconductor compounds 114 in the same bit line 104 are spaced apart from each other. In another example, referring to FIG. 3, multiple metal semiconductor compounds 114 in the same bit line 104 communicate with each other. FIG. 3 only shows that edges of adjacent metal semiconductor compounds 114 just contact each other to communicate. In practice, the contact area between adjacent metal semiconductor compounds 114 may be larger, and the contact area between adjacent metal semiconductor compounds 114 is not limited herein.

In other examples, the entire bit line may be made of only a metal semiconductor compound.

Taking silicon as the semiconductor element as an example, the metal semiconductor compound 114 includes at least one of cobalt silicide, nickel silicide, molybdenum silicide, titanium silicide, tungsten silicide, tantalum silicide or platinum silicide.

In this embodiment, multiple spaced-apart bit lines 104 may be formed on the base 11, and the bit lines 104 each may be in contact with at least one first doped region I.

FIGS. 1 to 4 show four spaced-apart bit lines 104, wherein the bit lines 104 each are in contact with four first doped regions I. The number of the bit lines 104 and the number of the first doped regions I in contact with each of the bit lines 104 may be set reasonably according to actual electrical requirements.

The bit line 104 is doped with a second type of ion, and the base 11 is doped with a first type of ion. The second type of ion is different from the first type of ion, and both the first type of ion and the second type of ion are one of N-type ion or P-type ion. In this way, the bit line 104 and the base 11 form a PN junction, the PN junction is conducive to preventing the bit line 104 from leaking, thereby further improving the electrical performance of the semiconductor structure. In other embodiments, the base 11 may not be doped with the first type of ion.

The N-type ion is at least one of arsenic ion, phosphorous ion or antimony ion, and the P-type ion is at least one of boron ion, indium ion or gallium ion.

In some embodiments of the present disclosure, the first doped region I, the channel region II and the second doped region III of the semiconductor channel 105 are doped with the same type of ion, that is, the second type of ion. The concentration of the doped ion in the first doped region I is equal to that of the doped ion in the channel region II and the second doped region III.

Therefore, the device formed by the semiconductor channel 105 is a junctionless transistor. That is, the types of doped ions in the first doped region I, the channel region II and the second doped region III are the same, for example, the N-type ion, and the doped ions in the first doped region I, the channel region II and the second doped region III may be the same. Wherein, the "junctionless" here refers to no PN junction, that is, there is no PN junction in the transistor formed by the semiconductor channel 105, and the doping concentrations of the doped ions in the first doped region I, the channel region II and the second doped region III are the same. Such benefits include: on one hand, there is no need to perform additional doping in the first doped region I and the second doped region III, thereby avoiding the problem that the doping process in the first doped region I and the second doped region III is difficult to control, especially as the size of the transistor is further reduced, if the first doped region I and the second doped region III are additionally doped, the doping concentration will become more difficult to control; on the other hand, because the device is a junctionless transistor, it avoids the use of an ultra-steep source/drain doping process to make an ultra-steep PN junction in a nanoscale range, therefore, problems such as threshold voltage drift and leakage current increase caused by abrupt changes in the doping concentration can be avoided, and the short channel effect can be easily suppressed, such that the device can still work in the range of a few nanometers, such a design further improves the integration density and electrical performance of the semiconductor structure. The additional doping here refers to doping to make the types of the doped ions in the first doped region I and the second doped region III different from that of the doped ion in the channel region II.

In some examples, the doping concentration of the second type of ion in the semiconductor channel 105 is $1\times10^{19}$ atom/cm$^3$ to $1\times10^{20}$ atom/cm$^3$. along the direction Z from the base 11 to the bit line 104, the height of the semiconductor channel 105 is 100 nm to 150 nm, and the heights of the first doped region I, the channel region II and the second doped region III are all 30 nm to 50 nm.

In this embodiment, an orthographic projection of the channel region II on the base 11 is smaller than that of the second doped region III on the base 11 and smaller than that of the first doped region I on the base 11. Thus, the channel region II can be formed with a smaller sectional area in a section perpendicular to the direction Z from the bit line 104 to the semiconductor channel 105. In this way, a subsequently formed word line can better control the channel region II, thereby facilitating the control of the on or off of the GAA transistor. In other embodiments, the orthographic projections of the first doped region, the channel region and the second doped region on the base may be equal. Alternatively, the orthographic projections of the channel region and the second doped region on the base are both smaller than the orthographic projection of the first doped region on the base.

In some examples, the width W and length L of the channel region II in the section perpendicular to the direction Z are not greater than 10 nm, which ensures that the subsequently formed word line well controls the channel region II.

The first dielectric layer 113 may include a fourth dielectric layer 143 and a fifth dielectric layer 153. The fourth dielectric layer 143 is located in intervals between adjacent bit lines 104 and is located in intervals between adjacent first doped regions I on adjacent bit lines 104. The fifth dielectric layer 153 is located on sidewalls of adjacent first doped regions I on the same bit line 104 and on a sidewall of the fourth dielectric layer 143. The first dielectric layer 113 is configured to achieve electrical insulation between adjacent semiconductor channels 105 and adjacent bit lines 104.

In some examples, the material of the fourth dielectric layer 143 and the material of the fifth dielectric layer 153 are the same, and both the material of the fourth dielectric layer 143 and the material of the fifth dielectric layer 153 may be silicon oxide. In other embodiments, the material of the fourth dielectric layer and the material of the fifth dielectric layer may also be different, as long as the materials of the fourth dielectric layer and the fifth dielectric layer are materials with good insulation effect.

In this embodiment, an orthographic projection of a periphery of the insulating layer 106 on the base 11 is smaller than that of a periphery of the second dielectric layer 123 on the base 11, that is, referring to FIGS. 2 and 4, compared to an outer wall of the second dielectric layer 123 away from the semiconductor channel 105, an outer wall of the insulating layer 106 away from the semiconductor channel 105 is closer to the semiconductor channel 105. In addition, compared to an outer wall of the first dielectric layer 113 away from the semiconductor channel 105, the outer wall of the insulating layer 106 away from the semiconductor channel 105 is also closer to the semiconductor channel 105. Wherein, the material of the insulating layer 106 is silicon oxide.

In other embodiments, the insulating layer and the second dielectric layer may be the same film structure, that is, the insulating layer and the second dielectric layer may be formed through the same process step. The material of the insulating layer and the material of the second dielectric layer include at least one of silicon oxide or silicon nitride.

The first interval, the second interval and the third interval connect with each other.

In some examples, referring to FIGS. 2 to 4, an orthographic projection of the first interval on the base 11 coincides with an orthographic projection of the second interval on the base 11. The third dielectric layer 133 fills up the first intervals, the second intervals and the third intervals, and a top surface of the third dielectric layer 133 away from the base 11 is higher than that of the second doped region III away from the base 11.

In some examples, referring to FIG. 5, voids 109 are provided in a part of the third dielectric layer 133 located in the second intervals. That is, in addition to the third dielectric layer 133, the void 109 is further provided between adjacent word lines 107 to reduce the capacitance generated between the adjacent word lines 107, thereby improving the electrical characteristics of the semiconductor structure. In other examples, the voids may not only be provided in a part of the third dielectric layer located in the second intervals, but may also be provided in a part of the third dielectric layer located in the first intervals or in a part of the third dielectric layer located in the third intervals.

The semiconductor structure may further include: a metal contact layer 108, located on top surfaces of the second doped regions III away from the base 11, wherein the metal contact layer 108 includes the same metal element as the metal semiconductor compound 114. The metal element includes at least one of cobalt, nickel, molybdenum, titanium, tungsten, tantalum or platinum.

Due to the metal element in the metal contact layer 108, when a bottom electrode of a capacitor structure is subsequently formed on the metal contact layer 108, the metal contact layer 108 forms an ohmic contact with the bottom electrode. Thus, the bottom electrode is prevented from being in direct contact with the semiconductor material to form a Schottky barrier contact. The ohmic contact design reduces the contact resistance between the second doped region III and the bottom electrode, reduces the energy consumption of the semiconductor structure and suppresses a resistive-capacitive (RC) delay effect, thereby improving the electrical performance of the semiconductor structure. In addition, in terms of the manufacturing process, since the metal contact layer 108 and the metal semiconductor compound 114 include the same metal element, it is conducive to forming the metal contact layer 108 and forming the metal semiconductor compounds 114 in the bit lines 104 in one process step.

In some embodiments of the present disclosure, an orthographic projection of a part of the metal contact layer 108 on the base 11 covers that of the second doped region III on the base 11. Thus, the contact area between the metal contact layer 108 and the bottom electrode is increased, so the contact resistance between the metal contact layer 108 and the bottom electrode is reduced, thereby improving the electrical performance of the semiconductor structure.

The semiconductor structure may further include: a transition layer 118, located between the second doped regions III and the metal contact layer 108 and partial top surfaces of the second doped regions III. The metal contact layer 108 wraps the remaining part of surface of the transition layer 118. The transition layer 118 and the second doped region III are doped with the same type of ion, and the doping concentration of the doped ion in the transition layer 118 is greater than that in the second doped region III. Therefore, the resistance of the transition layer 118 is less than that of the second doped region III, which further reduces the transmission resistance between the second doped region III and the bottom electrode.

In other embodiments, the semiconductor structure may not include the transition layer, and the top surfaces of the second doped regions are only provided with the metal contact layer.

The semiconductor structure may further include capacitor structures (not shown in the drawings), wherein the capacitor structures are located on a surface formed by the metal contact layer 108 and the third dielectric layer 133 together.

In summary, vertical GAA transistors are provided on the base 11, and the bit lines 104 are located between the base 11 and the GAA transistors, thereby forming a 3D stacked semiconductor structure, which increases the integration density of the semiconductor structure. The material of the bit line 104 include a metal semiconductor compound 114, which reduces the resistance of the bit line 104 and the contact resistance between the bit line 104 and the first doped region I, further improving the electrical performance of the semiconductor structure. The device formed by the semiconductor channel 105 is a junctionless transistor, which avoids the use of an ultra-steep source/drain doping process. Therefore, problems such as threshold voltage drift and leakage current increase caused by abrupt changes in the doping concentration can be avoided, and the short channel effect can be easily suppressed. Such a design further improves the integration density and electrical performance of the semiconductor structure.

Correspondingly, another embodiment of the present disclosure further provides a method of manufacturing a semiconductor structure, which may be used to manufacture the above semiconductor structure.

FIGS. 1 to 35 are schematic sectional diagrams corresponding to steps of the method of manufacturing a semiconductor structure provided by another embodiment. The method of manufacturing a semiconductor structure provided by this embodiment is described in detail below with reference to the drawings, and the parts the same as or corresponding to those mentioned in the above embodiment will not be repeated here.

Referring to FIGS. 6 to 9, a base 11 is provided, initial bit lines 124 are formed on the base 11, and semiconductor channels 105 are formed on surfaces of the initial bit lines 124 away from the base 11. The semiconductor channel 105 includes a first doped region I, a channel region II, and a second doped region III arranged in sequence along a direction that the base 11 points to the initial bit line 124.

Figure 6:
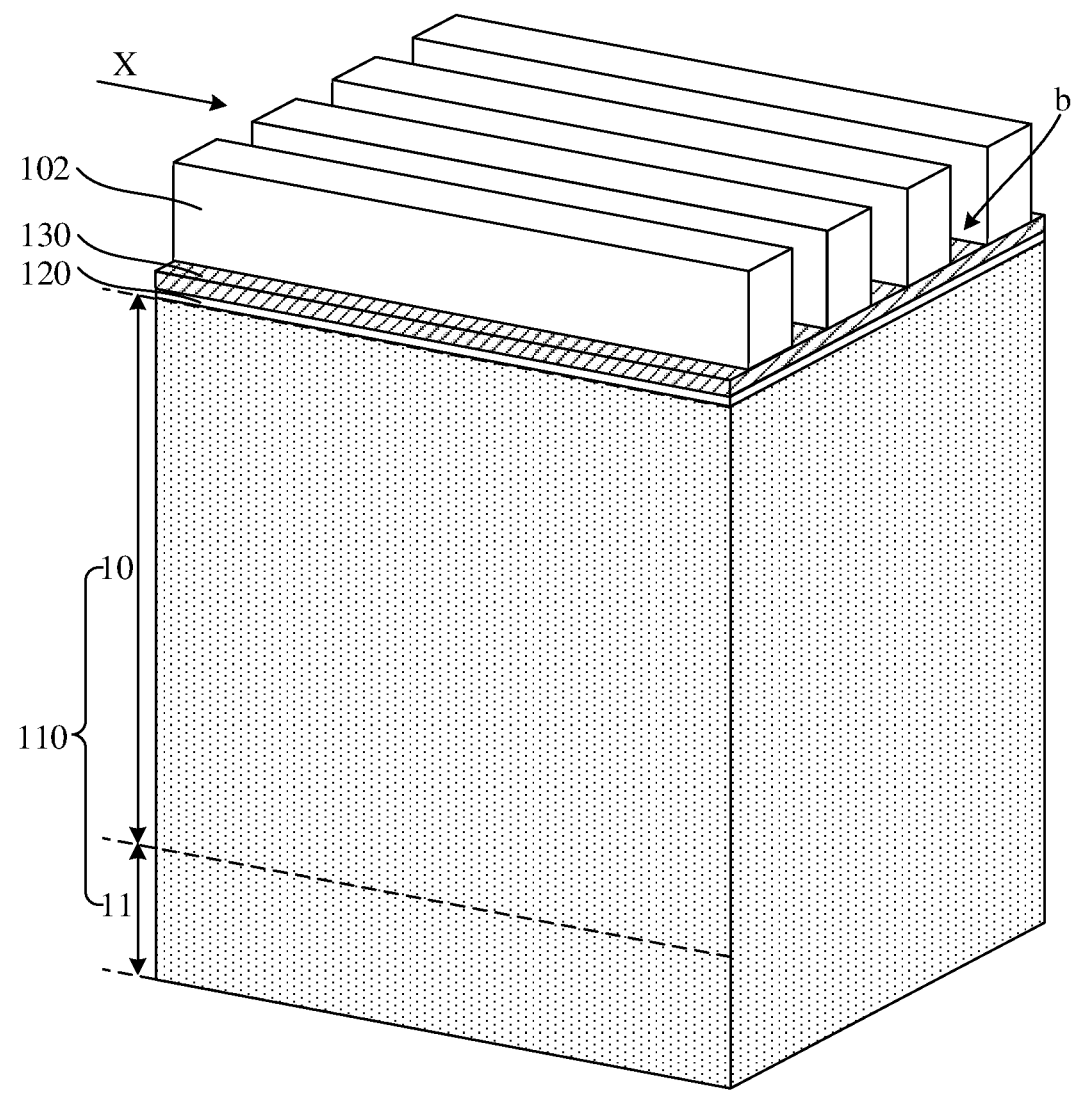

The providing the base 11 and forming the initial bit lines 124 and the semiconductor channels 105 on the base 11 includes:

Referring to FIG. 6, a substrate 110 is provided. The material type of the substrate 110 may be an elemental semiconductor material or a crystalline inorganic compound semiconductor material. The elemental semiconductor material may be silicon or germanium, and the crystalline inorganic compound semiconductor material may be silicon carbide, silicon germanium, gallium arsenide or indium gallium.

The substrate 110 includes: the base 11, the base 11 being doped with a first type of ion; and an initial semiconductor layer 10, provided on the base 11.

The initial semiconductor layer 10 is doped and annealed. The initial semiconductor layer 10 is doped with a second type of ion, such that the initial semiconductor layer 10 is subsequently etched to form the initial bit lines 124 and the semiconductor channels 105. The second type of ion is different from the first type of ion, and the first type of ion and the second type of ion are respectively one of N-type ion or P-type ion.

The doping treatment may be performed by high-temperature diffusion or ion implantation. When the initial semiconductor layer 10 is doped by ion implantation, the annealing temperature of annealing treatment is 800° C.-1000° C.

In this embodiment, the doping concentration of the second type of ion in the initial semiconductor layer 10 is $1\times10^{19}$ atom/cm$^3$ to $1\times10^{20}$ atom/cm$^3$, and along a direction from the initial semiconductor layer 10 to the base 11, the doping depth of the second type of ion in the initial semiconductor layer 10 is 150 nm-250 nm. In addition, the first type of ion is P-type ion, and the second type of ion is N-type ion. In other embodiments, the first type of ion may be N-type ion, and the second type of ion may be P-type ion.

A buffer layer 120 and a barrier layer 130 are sequentially stacked on a side of the initial semiconductor layer 10 away from the base 11. In some examples, the buffer layer 120 and the barrier layer 130 may be formed through a deposition process. The material of the buffer layer 120 is silicon oxide, and the material of the barrier layer 130 is made of silicon nitride.

In some embodiments of the present disclosure, silicon nitride may be deposited through a chemical vapor deposition process to form the barrier layer 130. The silicon nitride film layer is very slow to oxidize, which can protect the substrate 110 located under the silicon nitride film layer and prevent the substrate 110 from being oxidized.

In some examples, the substrate 110 is a silicon substrate. Due to the large mismatch of the lattice constant and thermal expansion coefficient of silicon nitride and the lattice constant and thermal expansion coefficient of the silicon substrate, if silicon nitride is directly formed on the silicon substrate, the defect density at the interface between silicon nitride and silicon is large, which is easy to become a carrier trap or recombination center, affecting the carrier mobility of silicon, thereby affecting the performance and working life of the semiconductor structure. In addition, the stress of the silicon nitride film is large, and it is easy to crack when directly deposited on the silicon substrate. Therefore, silicon oxide is deposited as the buffer layer 120 before the silicon nitride is deposited on the silicon substrate, thereby improving the performance and working life of the semiconductor structure.

Continuing to refer to FIG. 6, a first mask layer 102 is formed on the barrier layer 130, and the first mask layer 102 includes multiple first openings b separated from each other. The length of the first opening b along an extension direction X of the first openings b is consistent with that of the bit line formed subsequently.

Figure 7:
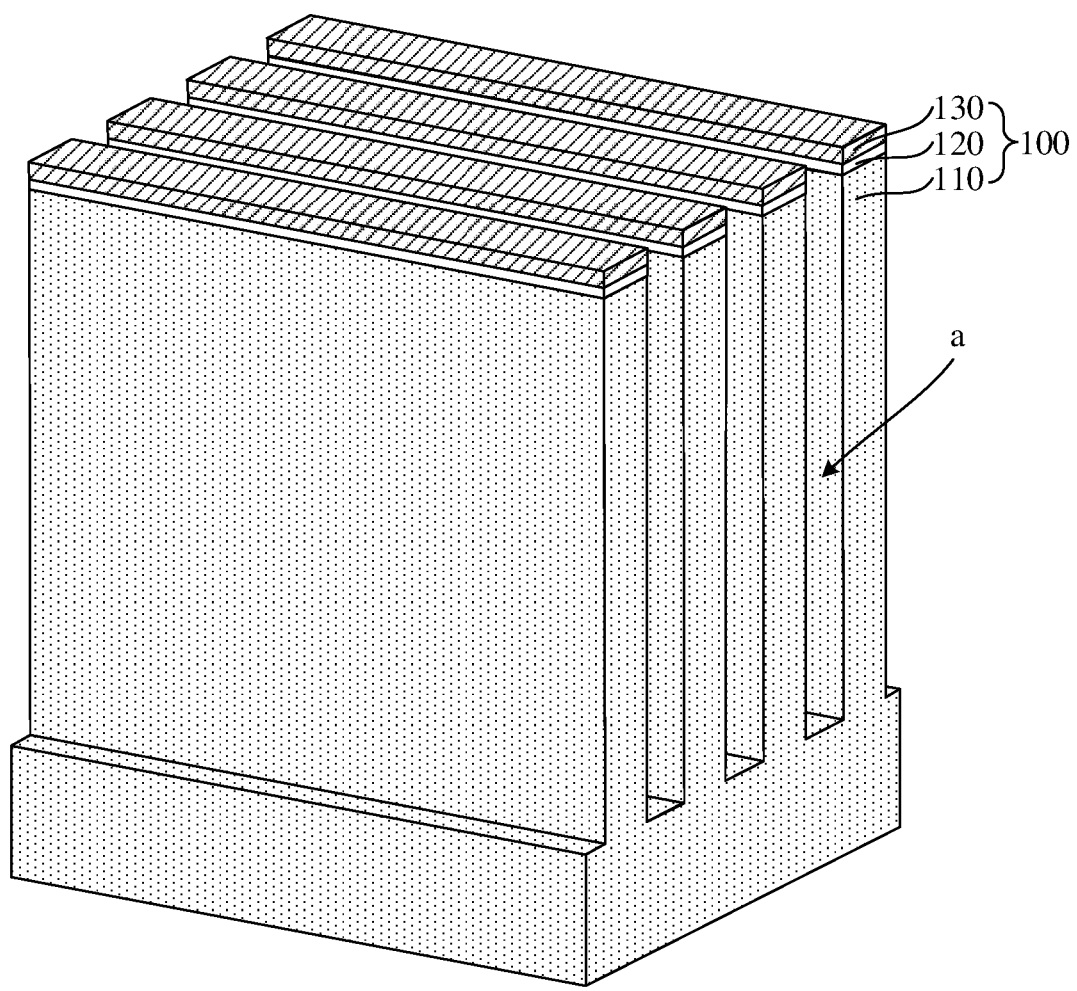

Referring to FIG. 7, the barrier layer 130, the buffer layer 120 and the initial semiconductor layer 10 are etched by using the first mask layer 102 as a mask, and form multiple first trenches a, and the first mask layer 102 is removed.

In this embodiment, the depth of the first trench a along a direction Z perpendicular to a surface of the base 11 is 250 nm-300 nm. Since the depth of the first trench a is greater than the doping depth of the second type of ion in the initial semiconductor layer 10, it is conductive to ensure that the initial semiconductor layer 10 doped with the second type of ion can be etched, so as to facilitate the subsequent formation of semiconductor channels and bit lines with a high doping concentration of the second type of ion.

Figure 8:
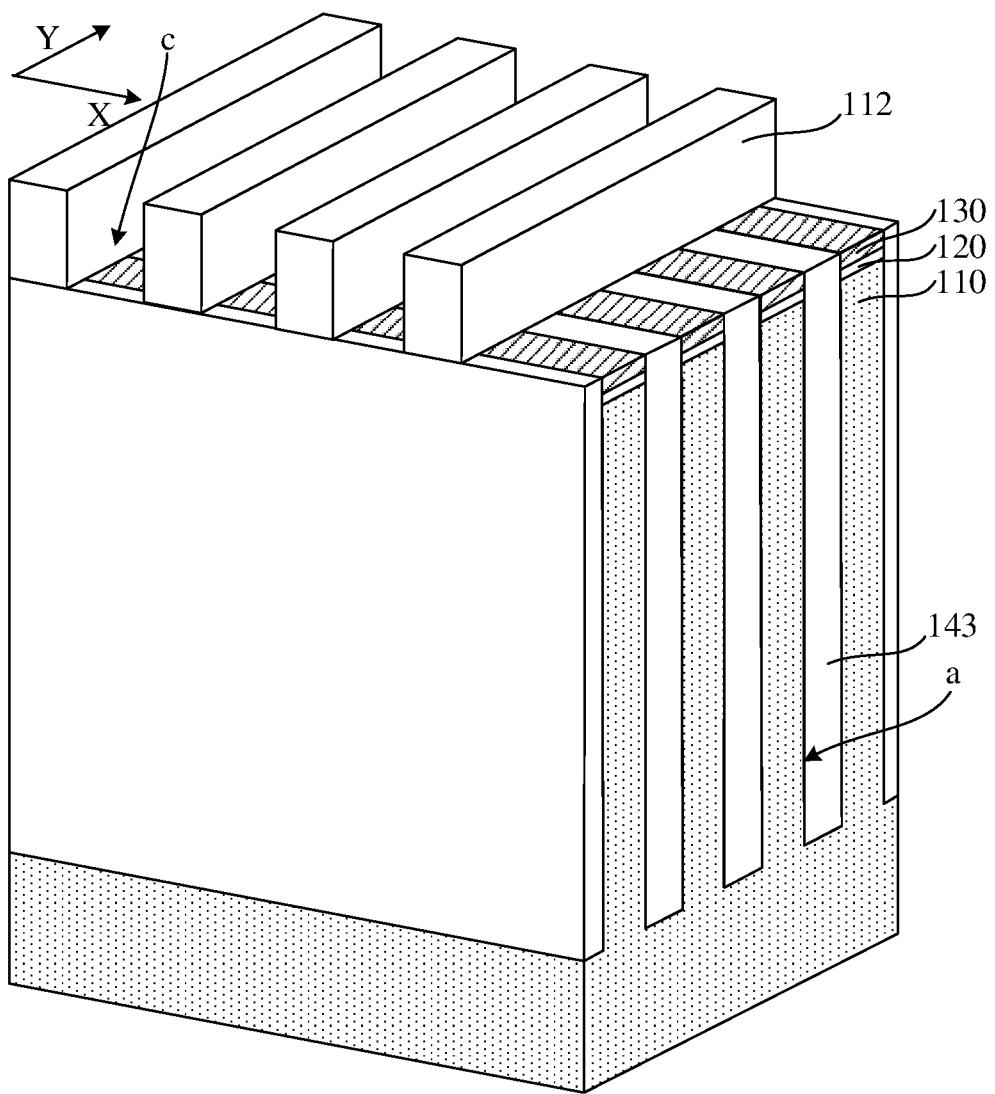

Referring to FIG. 8, a fourth dielectric layer 143 is formed in the first trenches a.

In this embodiment, the fourth dielectric layer 143 may be formed as: A deposition process is performed to form a fourth dielectric film covering a top surface of the barrier layer 130 and filling the first trenches The fourth dielectric film is chemically and mechanically flattened until the top surface of the barrier layer 130 is exposed, and the remaining part of the fourth dielectric film is used as the fourth dielectric layer 143. The material of the fourth dielectric film includes silicon oxide.

In some embodiments of the present disclosure, a second mask layer 112 is formed on a top surface formed by the fourth dielectric layer 143 and the remaining part of the substrate 110, and the second mask layer 112 includes multiple second openings c separated from each other. The length of the second opening c along an extension direction Y of the second opening c is consistent with that of the subsequently formed word line.

In this embodiment, referring to FIGS. 6 and 8, the extension direction X of the first opening b is perpendicular to the extension direction Y of the second opening c. Thus, the finally formed semiconductor channels 105 are in a 4F2 arrangement, which further improves the integration density of the semiconductor structure. In other embodiments, the extension direction of the first opening intersects the extension direction of the second opening, and an included angle between them may not be 90°.

In some embodiments of the present disclosure, a ratio of the opening width of the first opening b along the direction Y to the opening width of the second opening c along the direction X is 2 to 1, so as to ensure that through holes exposing a first dielectric layer surrounding sidewalls of the channel regions II can be subsequently formed, which facilitates the subsequent formation of first gaps for the manufacturing of the word lines. In some examples, the opening width of the first opening b along the direction Y is equal to that of the second opening c along the direction X, and the spacing between adjacent first openings b is equal to that between adjacent second openings c. On the one hand, multiple semiconductor channels formed subsequently are arranged regularly, which further improves the integration density of the semiconductor structure; on the other hand, the first mask layer 102 and the second mask layer 112 can be formed using a same mask, which is conducive to reducing the manufacturing cost of the semiconductor structure.

In this embodiment, both the first mask layer 102 and the second mask layer 112 may be formed through a self-aligned quadruple patterning (SAQP) technology or a self-aligned double patterning (SADP) technology.

Figure 9:
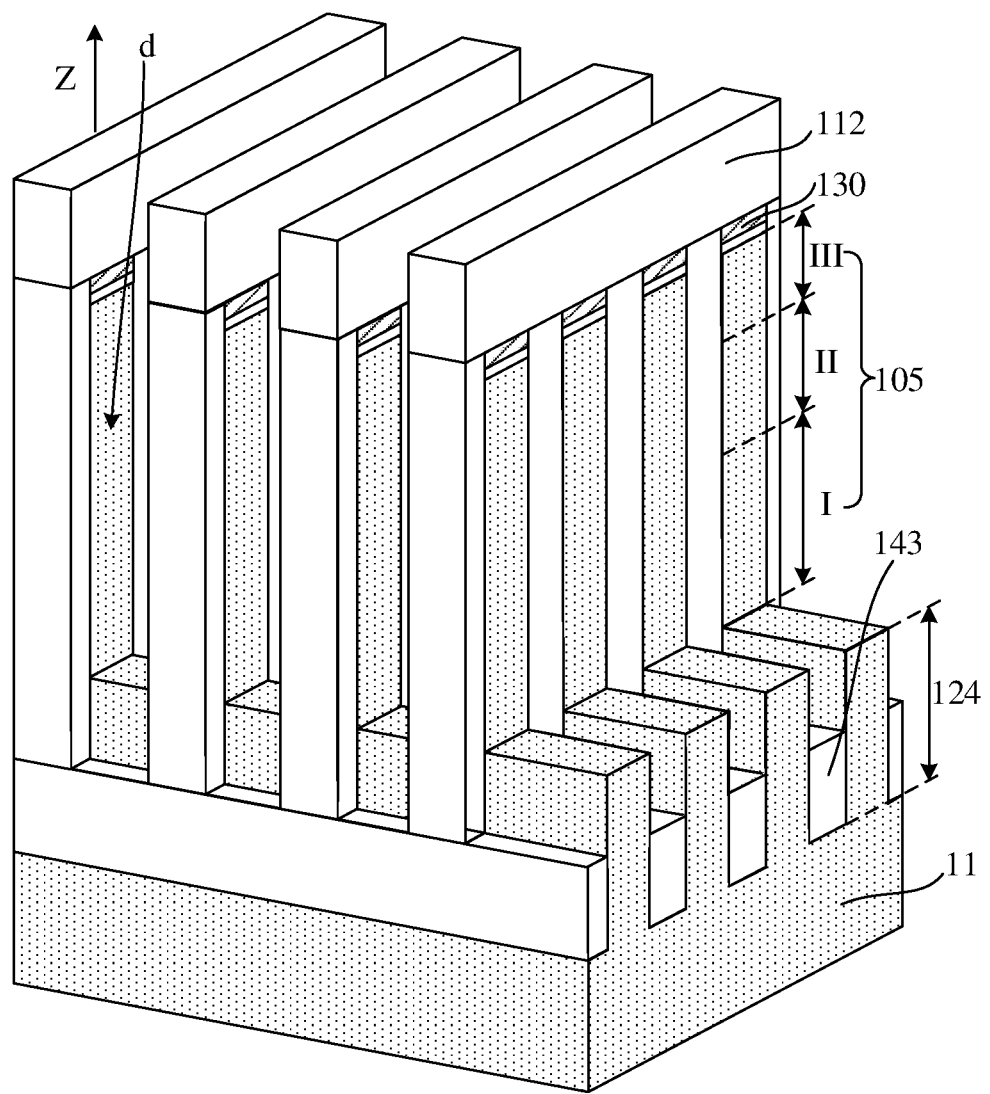

Referring to FIG. 9, the initial semiconductor layer 10 (shown in FIG. 6) and the fourth dielectric layer 143 are etched by using the second mask layer 112 as a mask, and form multiple second trenches d, initial bit lines 124 and semiconductor channels 105. The depth of the second trench d along the direction Z perpendicular to the surface of the base 11 is less than that of the first trench a. Thus, while the initial bit lines 124 are formed, multiple semiconductor channels 105 separated from each other are formed on a side of the initial bit line 124 away from the base 11, and the initial bit line 124 is in contact with the first doped regions I of the semiconductor channels 105. The second mask layer 112 is removed.

In some examples, the depth of the second trench d is 100 nm-150 nm. Since the doping depth of the second type of ion in the initial semiconductor layer 10 is 150 nm-250 nm, most or all of the initial semiconductor layer 10 doped with the second type of ion is converted into the semiconductor channels 105 after two etchings.

In addition, the material of the substrate 110 is silicon, and the material of the fourth dielectric layer 143 is silicon oxide. When the initial semiconductor layer 10 and the fourth dielectric layer 143 are etched by using the second mask layer 112 as a mask, the etch rate for the silicon oxide is greater than that for the silicon. Therefore, part of the sidewall of the initial bit line 124 is exposed.

In order to achieve electrical insulation between adjacent initial bit lines 124 and adjacent semiconductor channels 105, after the initial semiconductor layer 10 and the fourth dielectric layer 143 are etched by using the second mask layer 112 as a mask, the remaining part of the fourth dielectric layer 143 is located in the intervals between adjacent initial bit lines 124 and the intervals between adjacent semiconductor channels 105. The types of doped ions in the first doped region I, the channel region II and the second doped region III are the same, for example, the doped ion is N-type ion, and the doping concentrations of the doped ion in the first doped region I, the channel region II and the second doped region III are the same. That is, the device formed by the semiconductor channel 105 is a junctionless transistor. The doped ion in the first doped region I, the channel region II and the second doped region III may be the same. In this way, there is no need to perform additional doping in the first doped region I and the second doped region III, thereby avoiding the problem that the doping process in the first doped region I and the second doped region III is difficult to control. Especially as the size of the transistor is further reduced, if the first doped region I and the second doped region III are additionally doped, the doping concentration will become more difficult to control. In addition, because the device is a junctionless transistor, it avoids the use of an ultra-steep source/drain doping process to make an ultra-steep PN junction in a nanoscale range. Therefore, problems such as threshold voltage drift and leakage current increase caused by abrupt changes in the doping concentration can be avoided, and the short channel effect can be easily suppressed, such that the device can still work in the range of a few nanometers. Such a design further improves the integration density and electrical performance of the semiconductor structure. The additional doping here refers to doping to make the types of the doped ions in the first doped region I and the second doped region III different from that of the doped ion in the channel region II.

In some embodiments of the present disclosure, the semiconductor channels 105 form GAA transistors perpendicular to top surfaces of the initial bit lines 124 away from the base 11, thereby forming a 3D stacked semiconductor structure. The GAA transistors are designed with a small size without adversely affecting the electrical performance of the GAA transistors, which increases the integration density of the semiconductor structure.

In this embodiment, the first mask layer 102 and the second mask layer 112 are used to simultaneously form the initial bit lines 124 and the semiconductor channels 105 through two etching processes. On the one hand, it is conducive to adjusting the size of the semiconductor channel 105 by adjusting the sizes of the first opening b and the second opening c, and form the semiconductor channels 105 with high dimensional accuracy; on the other hand, the initial bit lines 124 and the semiconductor channels 105 are formed by etching the initial semiconductor layer 10. That is, the initial bit lines 124 and the semiconductor channels 105 are formed by using the same film structure, such that the initial bit lines 124 and the semiconductor channels 105 are integrated. This avoids the interface state defect between the initial bit lines 124 and the semiconductor channels 105 and improves the performance of the semiconductor structure. In addition, after the initial semiconductor layer 10 is etched by using the first mask layer 102 as a mask, the fourth dielectric layer 143 is further formed in the first trenches a. This prepares for the subsequent formation of a gap between the sidewall of the channel region II and a first isolation layer, and facilitates the subsequent formation of a first gap for preparing a word line.

Referring to FIGS. 10 to 35, a first dielectric layer 113 covering sidewall surfaces of the first doped regions I is formed, and a first interval is provided between parts of the first dielectric layer 113 covering sidewalls of adjacent first doped regions I on the same initial bit line 124. An insulating layer 106 covering sidewall surfaces of the channel regions II is formed. Word lines 107 covering a sidewall surface of the insulating layer 106 away from the channel regions II are formed, and a second interval is provided between adjacent word lines 107. A second dielectric layer 123 covering sidewall surfaces of the second doped regions III is formed, and a third interval is provided between parts of the second dielectric layer 123 on sidewalls of adjacent second doped regions III. The first interval, the second interval and the third interval connect and expose the initial bit line 124 partially. Exposed initial bit lines 124 are metalized to form bit lines 104. The material of the bit line 104 includes a metal semiconductor compound 114.

Figure 11:
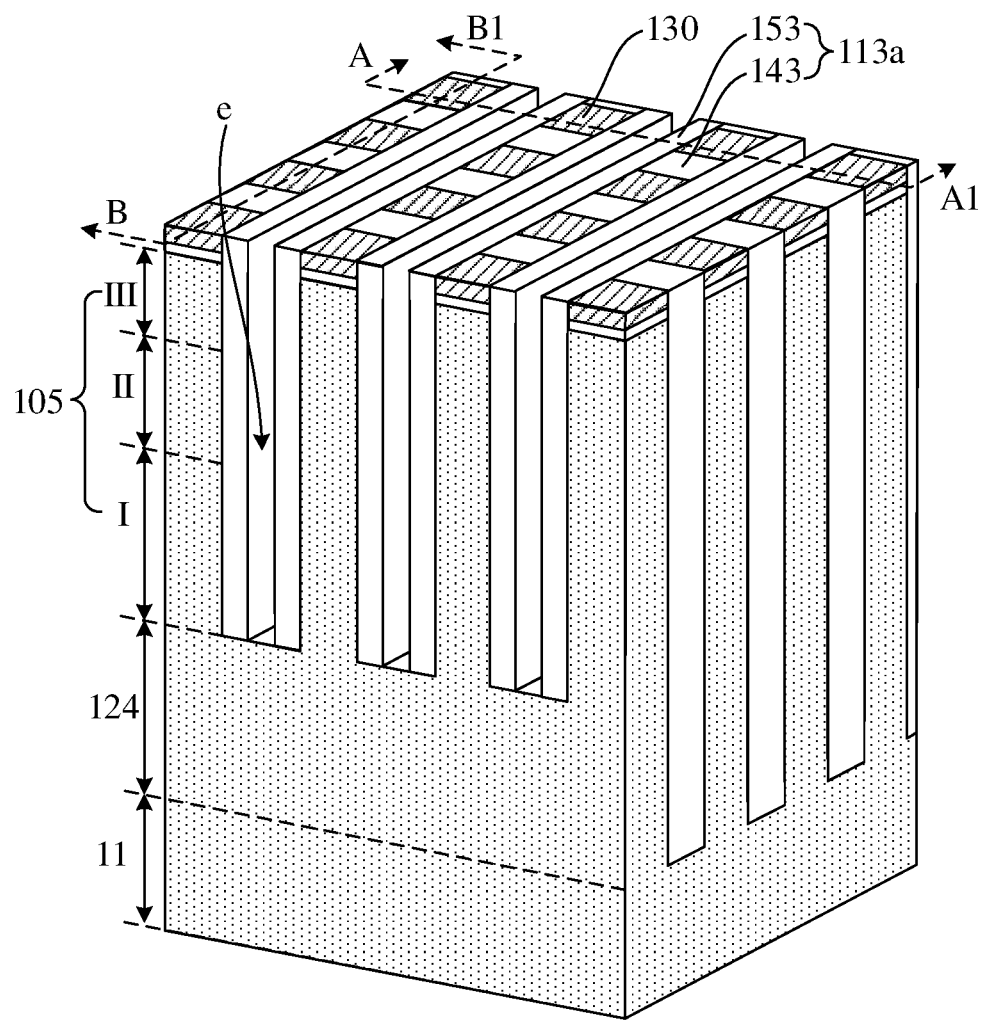
Figure 12:
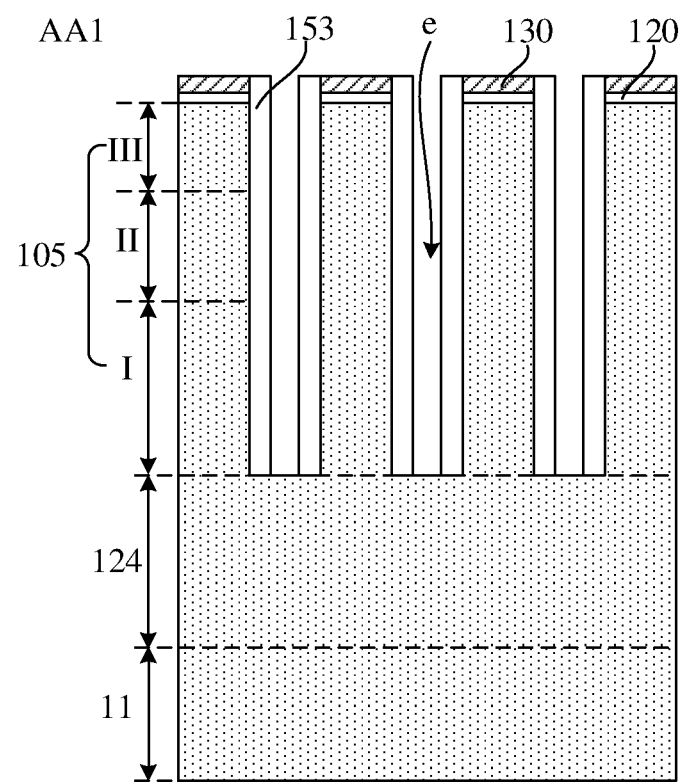
Figure 13:
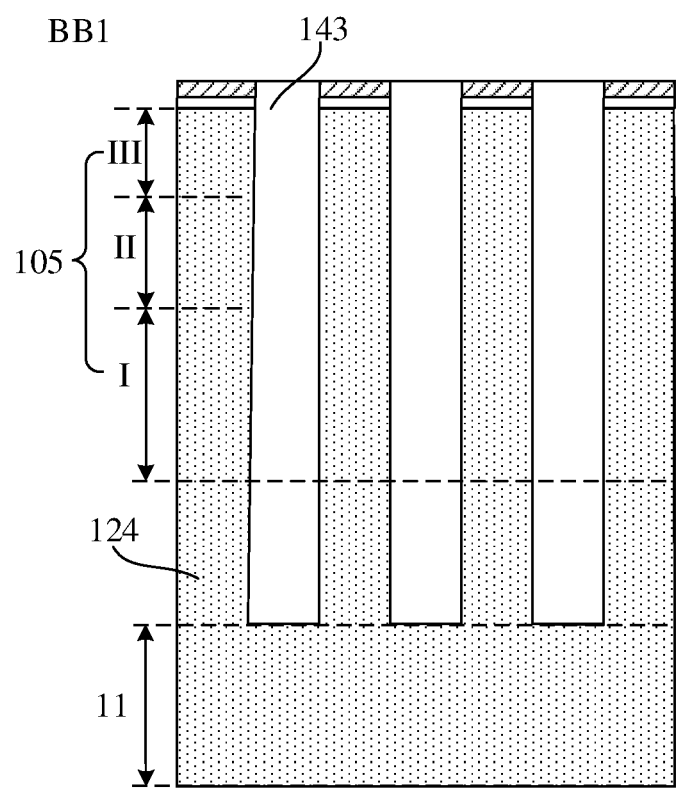

FIG. 12 is a schematic sectional diagram of the structure shown in FIG. 11 along a first sectional direction AA1, and FIG. 13 is a schematic sectional diagram of the structure shown in FIG. 11 along a second sectional direction BB1. One or both of the schematic sectional diagram along the first sectional direction AA1 and the schematic sectional diagram along the second sectional direction BB1 will be set later according to the requirements of the description. When referring to only one drawing, the drawing is the schematic sectional diagram along the first sectional direction AA1. When referring to two drawings at the same time, the first drawing is the schematic sectional diagram along the first sectional direction AA1, and the second drawing is the schematic sectional diagram along the second sectional direction BB1.

Figure 10:
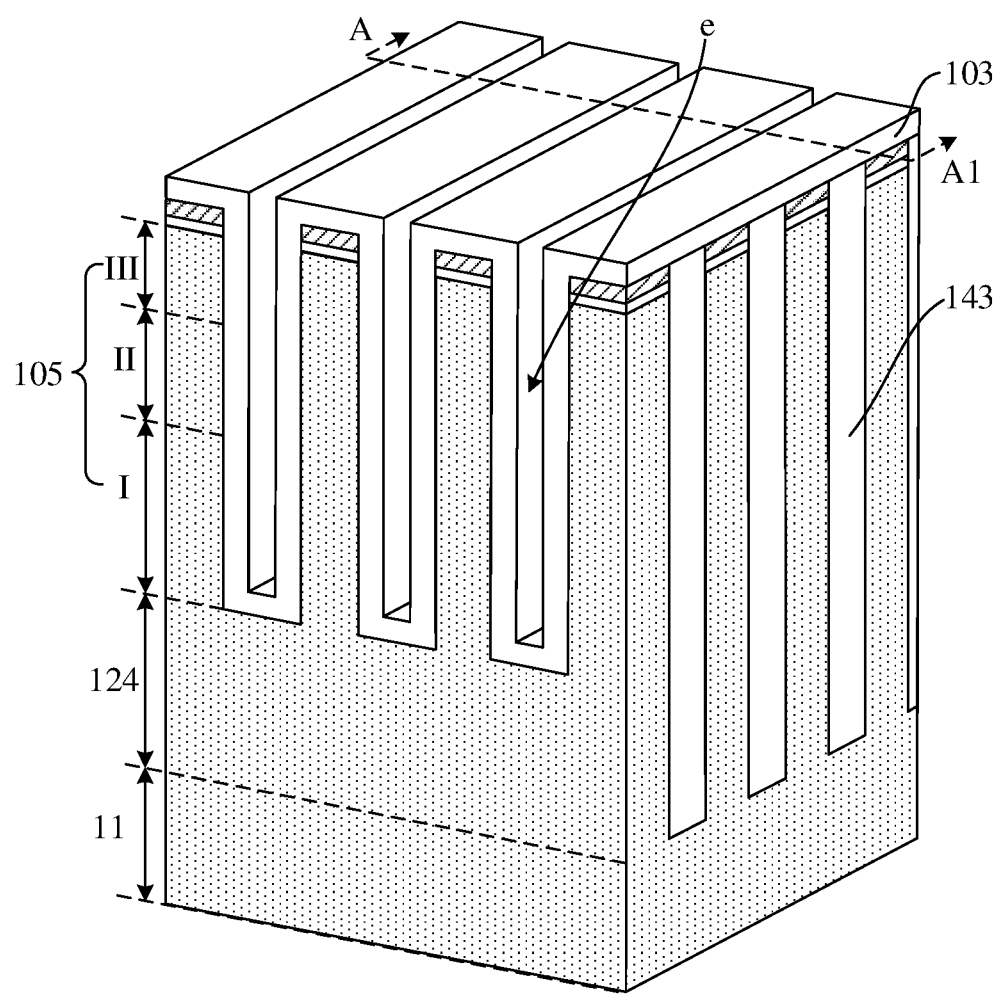

In some examples, referring to FIGS. 10 to 27, forming the first dielectric layer 113, the insulating layer 106, the word lines 107 and the second dielectric layer 123 includes:

Referring to FIGS. 10 to 11, an initial first dielectric layer 113a is formed. The initial first dielectric layer 113a surrounds the sidewalls of the semiconductor channels 105. A fourth interval e is provided between parts of the initial first dielectric layer 113a located on the sidewalls of adjacent semiconductor channels 105 on the same initial bit line 124.

Referring to FIG. 10, a fifth dielectric film 103 is formed. The fifth dielectric film 103 conformally covers the sidewalls and bottoms of the second trenches d (referring to FIG. 9), and is also located on top surfaces of the barrier layer 130 and the fourth dielectric layer 143.

Referring to FIGS. 10 and 11, the fifth dielectric film 103 is subjected to a maskless dry etching process until the barrier layer 130 is exposed. In the same etching time, different regions of the fifth dielectric film 103 are etched by the same thickness, and form the fifth dielectric layer 153.

Referring to FIGS. 11 to 13, the fifth dielectric layer 153 is located on sidewalls of the second trenches d (shown in FIG. 9), and the fourth dielectric layer 143 is located in the intervals between adjacent semiconductor channels 105. The fourth dielectric layer 143 and the fifth dielectric layer 153 form the initial first dielectric layer 113a together, and a fourth interval e is provided between parts of the fifth dielectric layer 153 located on the sidewall of the second trenches d.

A material of the fourth dielectric layer 143 is the same as a material of the fifth dielectric layer 153, which is convenient to remove a part of the fourth dielectric layer 143 and a part of the fifth dielectric layer 153 corresponding to the sidewalls of the channel regions II together through an etching process, thereby forming a void between the sidewall of the channel region II and a first isolation layer formed subsequently, which is conducive to the subsequent formation of gaps for preparing word lines. The material of the fourth dielectric layer 143 and the material of the fifth dielectric layer 153 are both silicon oxide.

In other embodiments, the material of the fourth dielectric layer and the material of the fifth dielectric layer may also be different, as long as the material of the fourth dielectric layer and the material of the fifth dielectric layer are materials with good insulation effect, and then the part of the fourth dielectric layer and the part of the fifth dielectric layer corresponding to the sidewalls of the channel regions may be removed step by step.

Figure 14:
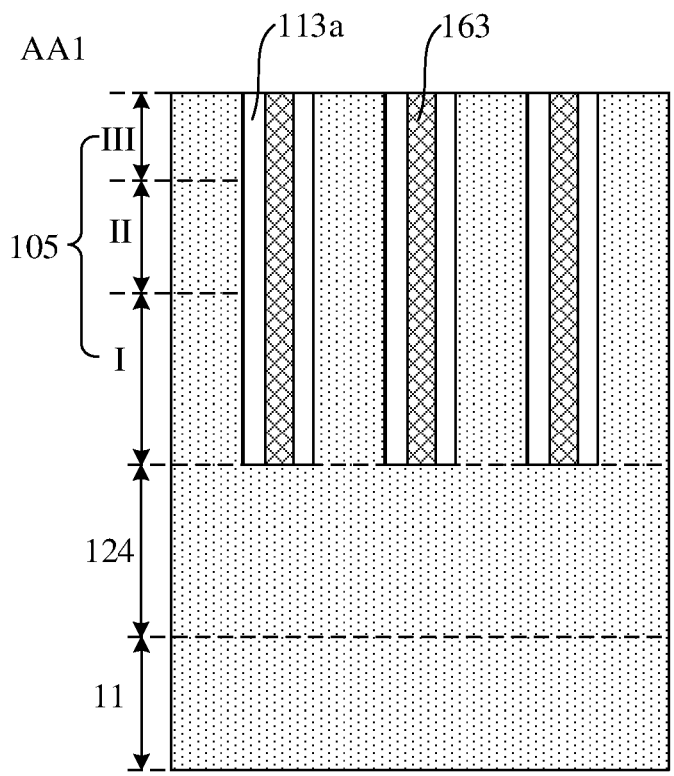

Referring to FIG. 14, a first isolation layer 163 is formed. The first isolation layer 163 fills up the fourth intervals e, and the material of the first isolation layer 163 and the material of the initial first dielectric layer 113a are different.

The first isolation layer 163 may be formed as: A first isolation film covering the top surface of the barrier layer 130 and filling the fourth intervals e is formed through a deposition process. The first isolation film, the barrier layer 130, the buffer layer 120 and the initial first dielectric layer 113a are chemically and mechanically flattened until the top surfaces of the second doped regions III are exposed. The remaining part of the first isolation film is used as the first isolation layer 163. The material of the first isolation film includes silicon nitride.

Figure 15:
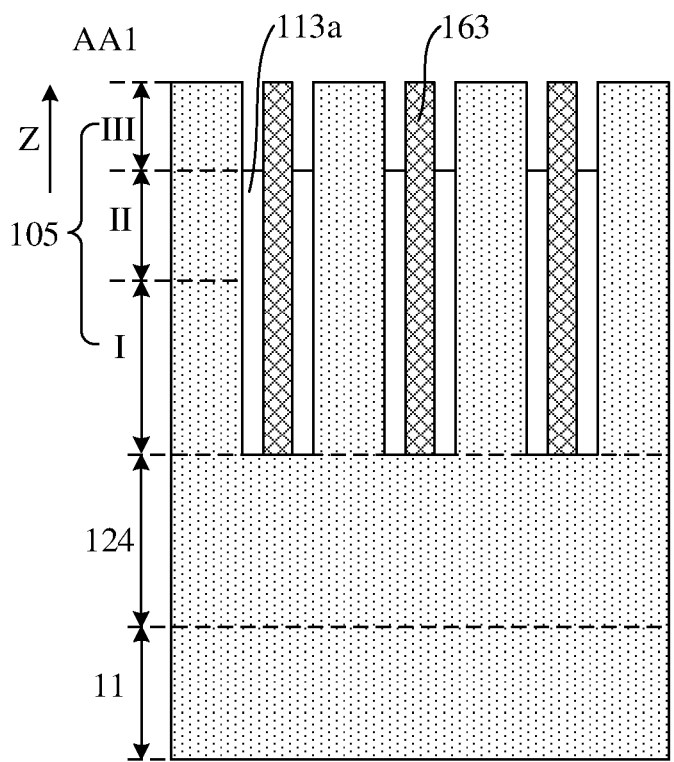

Referring to FIG. 15, the initial first dielectric layer 113a is partially etched to expose the sidewalls of the second doped regions III.

Figure 16:
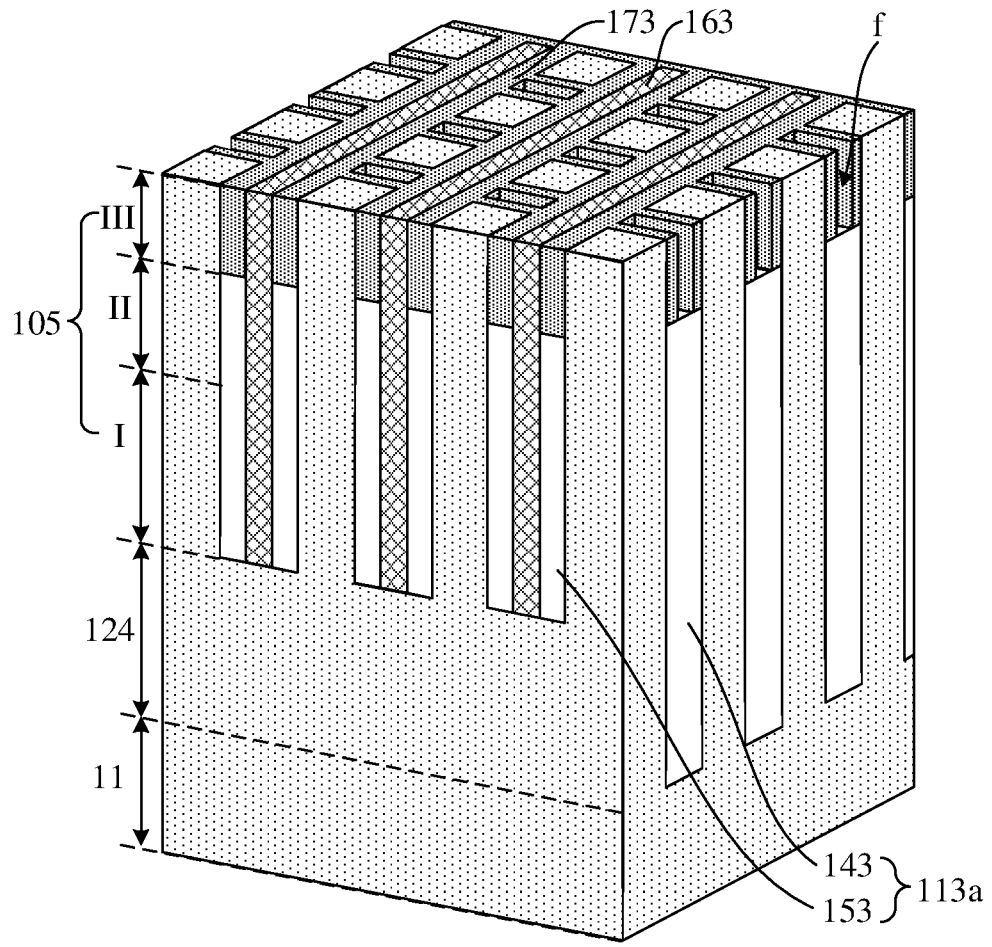
Figure 17:
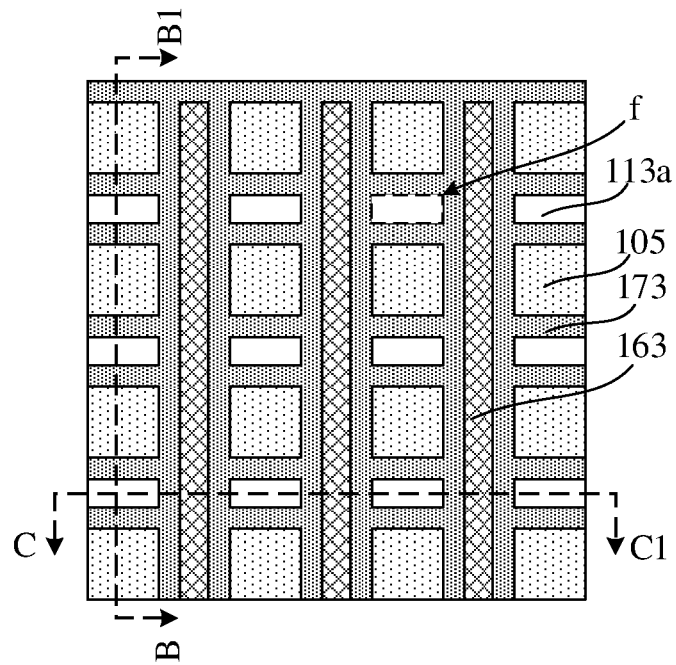
Figure 18:
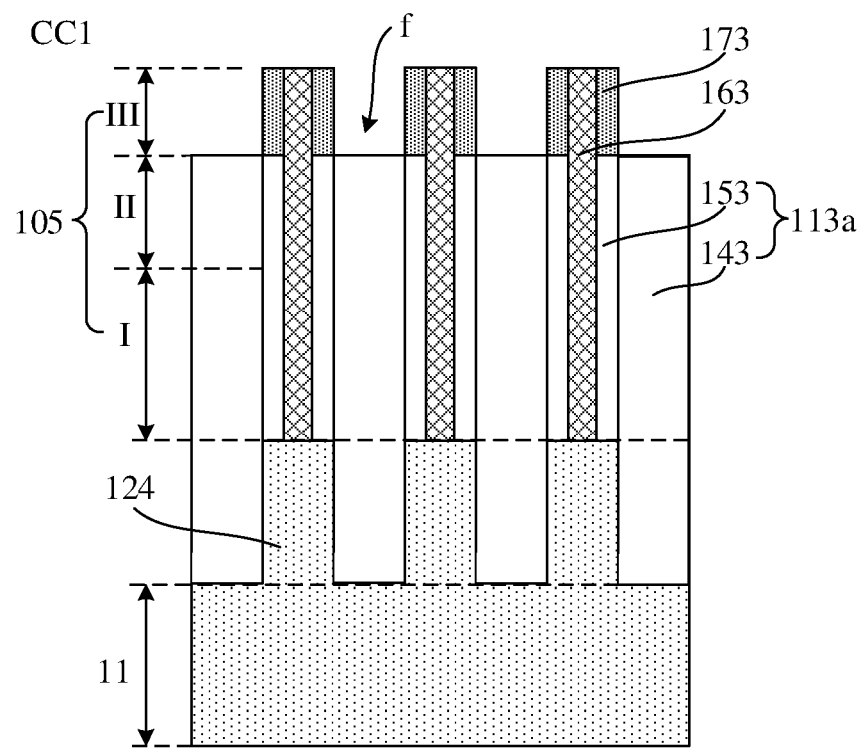
Figure 19:
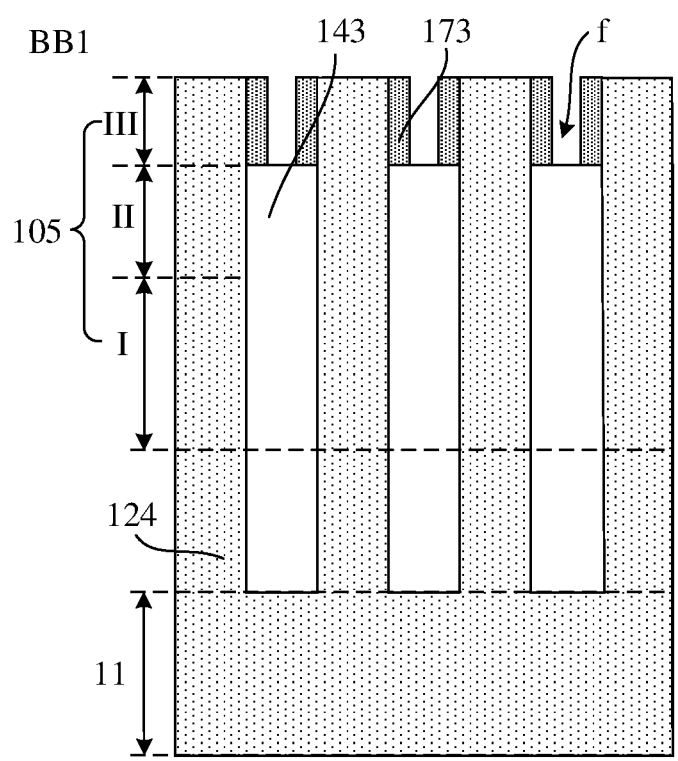

Referring to FIGS. 16 to 19, wherein FIG. 17 is a top view of FIG. 16, FIG. 18 is a schematic sectional diagram along a third sectional direction CC1, and FIG. 19 is a schematic sectional diagram along a second sectional direction BB1.

A second isolation layer 173 is formed. The second isolation layer 173 surrounds the sidewalls of the second doped regions III and is located on the sidewall of the first isolation layer 163. A part of the second isolation layer 173 located on the sidewalls of the second doped regions III and a part of the second isolation layer 173 located on the sidewall of the first isolation layer 163 define through holes f. The initial first dielectric layer 113a is exposed at the bottoms of the through holes f. The material of the second isolation layer 173 and the material of the initial first dielectric layer 113a are different.

In some embodiments of the present disclosure, referring to FIGS. 18 and 19, the second isolation layer 173 covers the top surface of the fifth dielectric layer 153 and partial top surface of the fourth dielectric layer 143 while surrounding the sidewalls of the second doped regions III. The through holes f expose partial top surface of the fourth dielectric layer 143.

In this embodiment, the second isolation layer 173 may be formed as: A second isolation film is formed through a deposition process to conformally cover a surface formed by the semiconductor channels 105, the initial first dielectric layer 113a and the first isolation layer 163. The second isolation film is subjected to a maskless dry etching process until the top surfaces of the second doped regions III are exposed. In the same etching time, different regions of the second isolation film are etched by the same thickness and form the second isolation layer 173 exposing the first isolation layer 163. The material of the second isolation layer 173 includes silicon nitride.

In addition, in the first mask layer 102 and the second mask layer 112 mentioned above, a ratio of the opening width of the first opening b along the direction Y to the opening width of the second opening c along the direction X is 2 to 1. When forming the second isolation layer 173, it is conducive to ensuring that the second isolation layer 173 fills up the interval between adjacent semiconductor channels 105 on the same initial bit line 124, but does not fill up the gap between adjacent semiconductor channels 105 on adjacent initial bit lines 124. so as to ensure the formation of the through holes f exposing partial top surface of the fourth dielectric layer 143, which facilitates the subsequent removal of partial initial first dielectric layer 113a using the through holes f.

Figure 20:
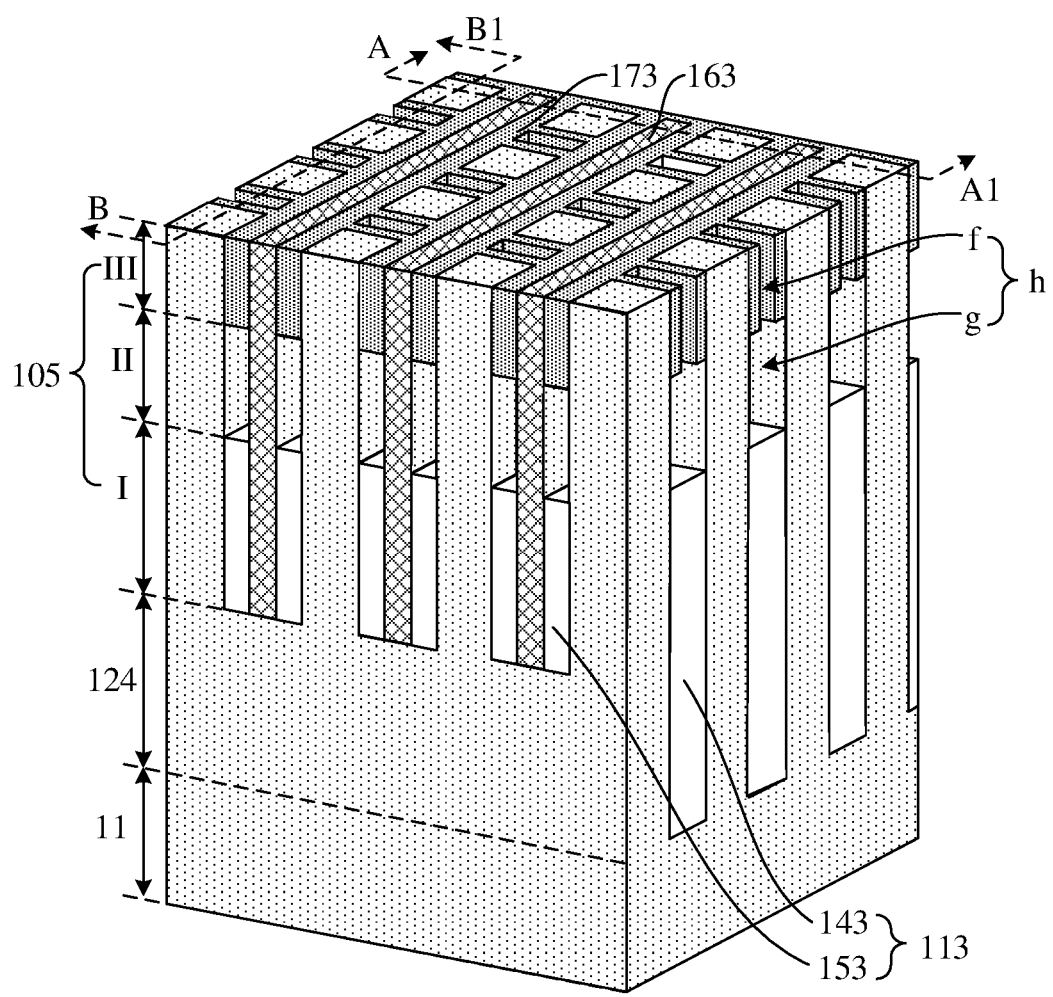
Figure 21:
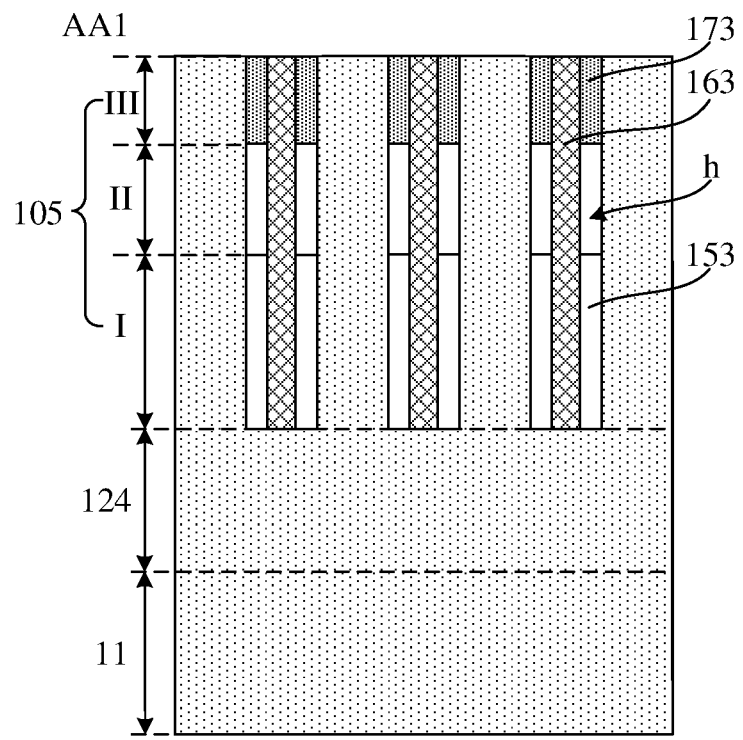
Figure 22:
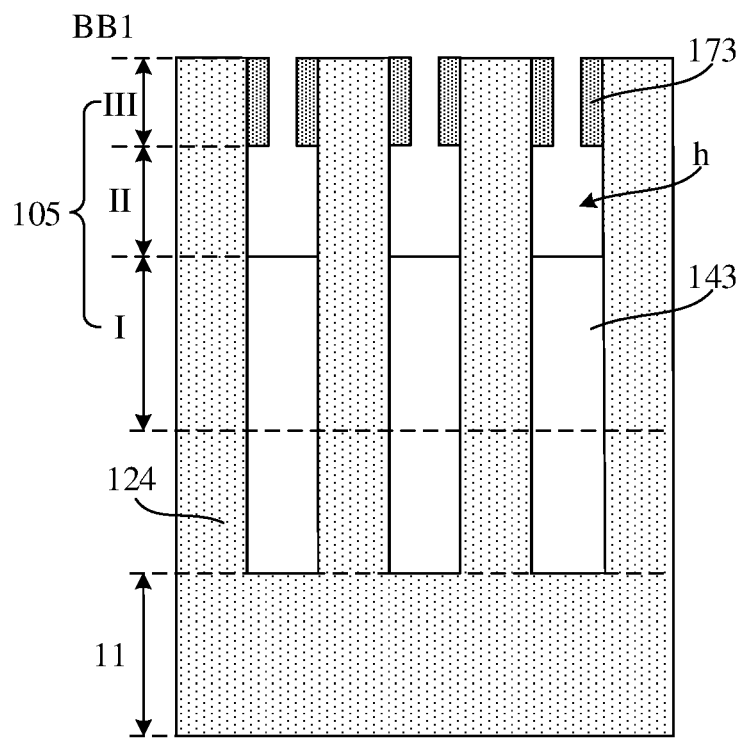

Referring to FIGS. 20 to 22, a part of the initial first dielectric layer 113a located on the sidewalls of the channel regions II exposed by the through holes f is removed, and the remaining part of the initial first dielectric layer 113a is used as the first dielectric layer 113.

Since the through holes f expose partial top surface of the first dielectric layer 113, and the material of the first dielectric layer 113, is different from the material of the second dielectric layer 123 and the material of the third dielectric layer 133, an etching solution may be injected into the through holes f, to remove a part of the first dielectric layer 113 located on the sidewalls of the channel regions II through a wet etching process, and retain a part of the first dielectric layer 113 located on the sidewalls of the first doped regions I.

In addition, the first isolation layer 163 and the second isolation layer 173 together form a support frame. The support frame is in contact with the second doped regions III, and the support frame is partially buried in the first dielectric layer 113. In wet etching process, on the one hand, the support frame plays a role of supporting and fixing the semiconductor channels 105, when the etching solution flows, a pressing force is generated on the semiconductor channels 105, which is conducive to preventing the semiconductor channels 105 from being pressed to be tilted or shifted, thereby improving the stability of the semiconductor structure; on the other hand, the support frame wraps the sidewalls of the second doped regions III, which is conducive to preventing the etching solution from damaging the second doped regions III.

After the part of the initial first dielectric layer 113a located on the sidewalls of the channel regions II is removed, second gaps g are formed between the channel regions II and the first isolation layer 163, and the through hole f and the second gap g form a cave structure h together.

Figure 23:
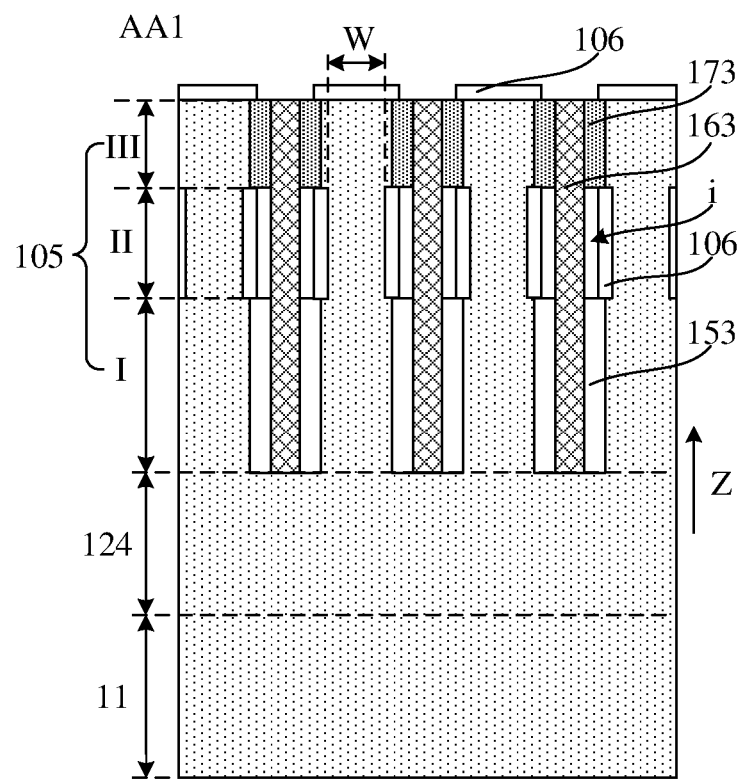
Figure 24:
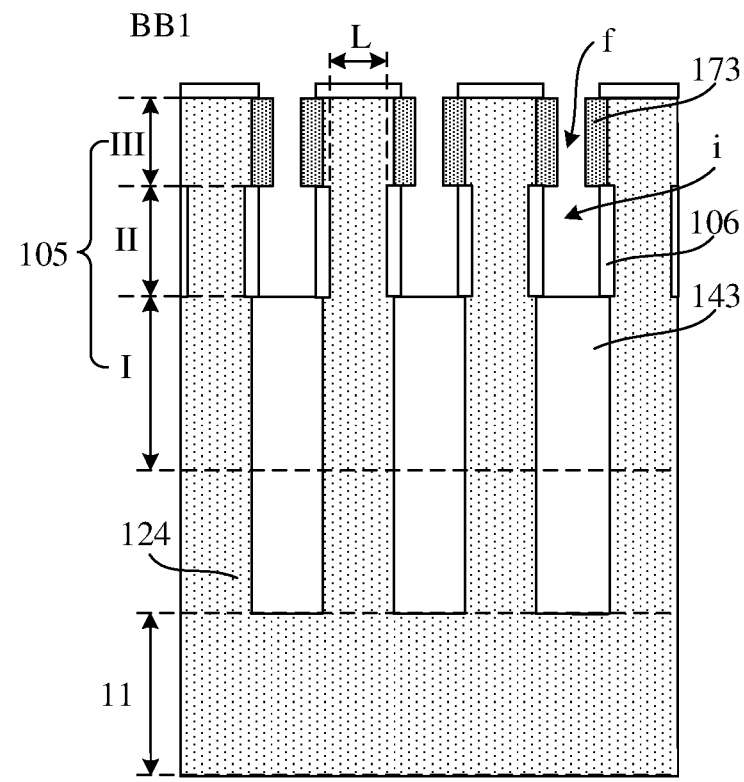

Referring to FIGS. 23 and 24, the sidewalls of the channel regions II exposed are thermally oxidized, to form the insulating layer 106. The insulating layer 106 covers the sidewall surfaces of the remaining parts of the channel regions II, and fifth intervals i are provided between the insulating layer 106 and the first isolation layer 163.

In some embodiments of the present disclosure, referring to FIG. 24, the fifth intervals i are also located between parts of the insulating layer 106 on the sidewalls of adjacent semiconductor channels 105 on adjacent initial bit lines 124.

During the thermal oxidation treatment, since the top surfaces of the second doped regions III are also exposed, partial regions of the second doped regions III close to the top surfaces and partial regions of the channel regions II are converted into the insulating layer 106. Thus, an orthographic projection of the channel region II on the base 11 is smaller than that of the second doped region III on the base 11 and smaller than that of the first doped region I on the base 11. Thus, the channel regions II can be formed with a smaller sectional area in section perpendicular to the direction Z from the initial bit line 124 to the semiconductor channel 105, without the need for an etching process. In this way, subsequently formed word lines can better control the channel regions II, thereby facilitating the control of the on or off of the GAA transistors. The material of the insulating layer 106 is silicon oxide. In other embodiments, the insulating layer covering the sidewall surfaces of the channel regions may also be formed through a deposition process.

In this embodiment, the part of the insulating layer 106 on the top surfaces of the remaining parts of the second doped regions III are removed in a subsequent process. In other embodiments, the part of the insulating layer on the top surfaces of the remaining parts of the second doped regions may be removed after the thermal oxidation treatment, retaining only the part of the insulating layer covering the sidewall surfaces of the remaining parts of the channel regions.

Continuing to refer to FIGS. 23 and 24, an orthographic projection of a periphery of the insulating layer 106 on the base 11 is smaller than that of a periphery of the second isolation layer 173 on the base 11. That is, compared to an outer wall of the second isolation layer 173 away from the semiconductor channels 105, an outer wall of the insulating layer 106 away from the semiconductor channels 105 is closer to the semiconductor channels 105. In this way, the fifth intervals i can be formed between the insulating layer 106 and the first isolation layer 163, such that the subsequently formed word lines can surround the part of the insulating layer 106 located on the sidewalls of the channel regions II. In addition, compared to an outer wall of the first dielectric layer 113 (shown in FIG. 20) away from the semiconductor channels 105, the outer wall of the insulating layer 106 away from the semiconductor channels 105 may also be closer to the semiconductor channels 105.

Figure 25:
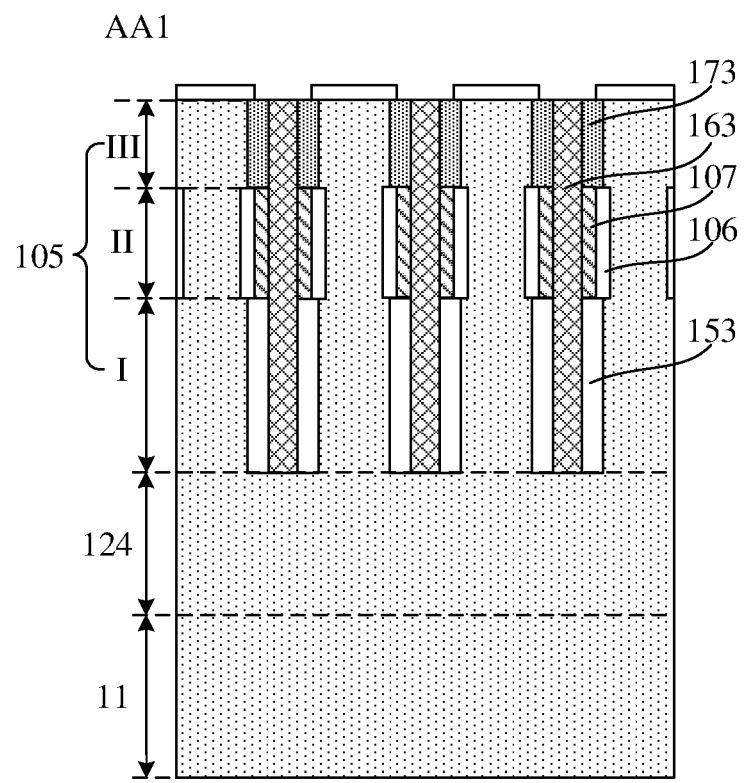
Figure 26:
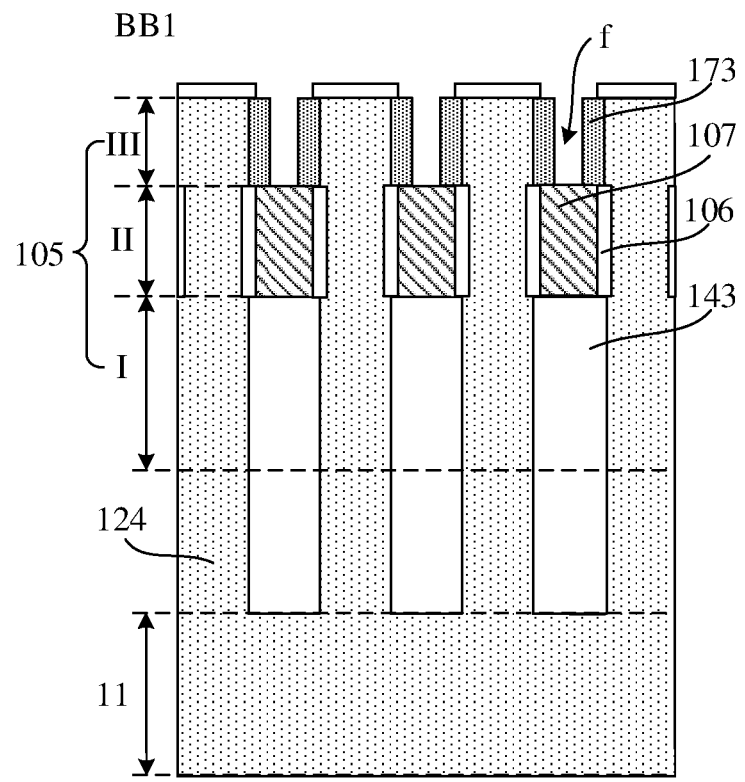
Figure 27:
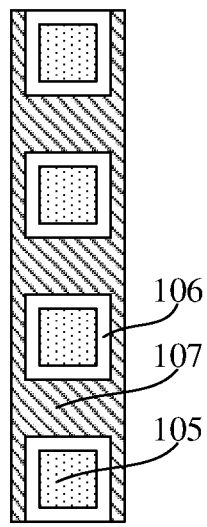

Referring to FIGS. 25 to 27, initial word lines are formed. The initial word line fills up the fifth interval i and the through hole f, and the initial word lines are also located between parts of the insulating layer 106 on the sidewalls of the channel regions II on adjacent initial bit lines 124. The part of the initial word line located in the through hole f is removed, and the remaining part of the initial word line is used as the word line 107. The initial word lines may be formed through a deposition process, and the material of the initial word line includes at least one of polysilicon, titanium nitride, tantalum nitride, copper or tungsten.

The initial word line fills up the cave structure h (shown in FIG. 20) in a self-aligned manner. After a part of the initial word line located in the through hole f is removed, the word line 107 can be formed with an accurate size in a self-aligned manner. There is no need to design the size of the word line 107 through an etching process, which simplifies the manufacturing of the word lines 107. In addition, by adjusting the size of the fifth interval i, the small-sized word lines 107 may be obtained.

Figure 28:
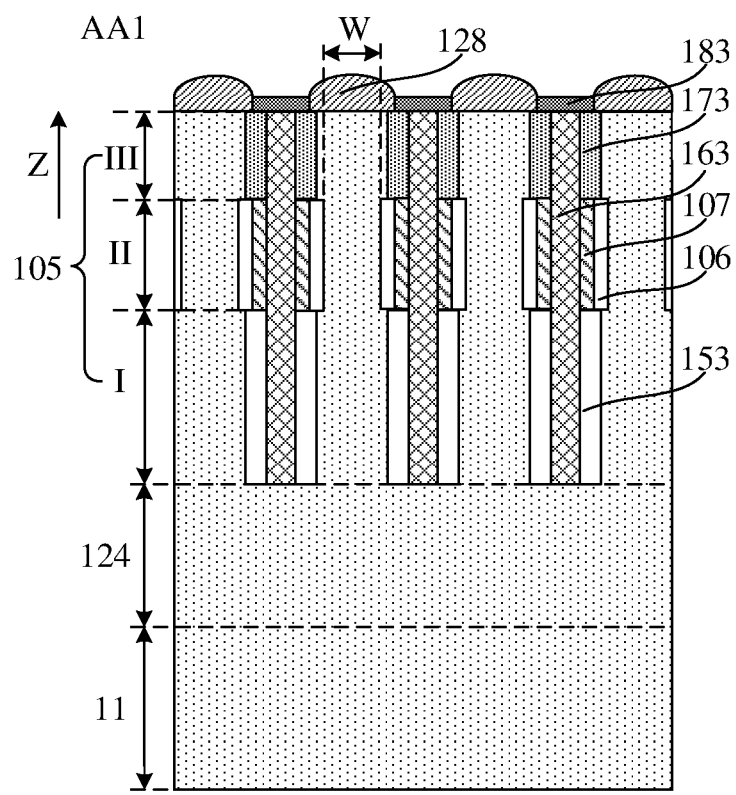

Referring to FIG. 28, after the word lines 107 are formed, a third isolation layer 183 is formed. The third isolation layer 183 fills up the through holes f (shown in FIG. 26).

In this embodiment, the third isolation layer 183 may be formed as: A third isolation film covering the top surface of the part of the insulating layer 106 located on the top surfaces of the second doped regions III and filling up the through holes f is formed through a deposition process. The third isolation film is chemically and mechanically flattened until the top surface of the part of the insulating layer 106 is exposed, and the remaining part of the third isolation film is used as the third isolation layer 183. The material of the third isolation film is the same as the material of the first isolation layer and the second isolation layer, including silicon nitride. In other embodiments, the third isolation film may also be chemically and mechanically flattened until the top surfaces of the second doped regions are exposed. That is, the part of the insulating layer located on the top surfaces of the second doped regions is simultaneously removed, and the remaining part of the third isolation film is used as the third isolation layer.

Continuing to refer to FIG. 28, the part of the insulating layer 106 located on the top surfaces of the second doped regions III is removed. An initial transition layer 128 is formed on the top surfaces of the second doped regions III through an epitaxial growth process. An orthographic projection of a part of the initial transition layer 128 on the base 11 covers that of the second doped region III on the base 11.

In addition, during the epitaxial growth process, the initial transition layer 128 is further doped with the same type of doped ion as in the second doped regions III. The doping concentration of the doped ion in the initial transition layer 128 is greater than that of the doped ion in the second doped regions III, so the resistance of the initial transition layer 128 is less than that of the second doped regions III.

On the one hand, using the epitaxial growth process is conducive to improving the continuity between the second doped regions III and the initial transition layer 128, reducing contact defects caused by different lattice characteristics or lattice dislocations, reducing contact resistance caused by the contact defects, and improving the transport capacity and moving speed of carriers, thereby improving the conductivity between the second doped regions III and the initial transition layer 128, to reduce the heat generated during the operation of the semiconductor structure; on the other hand, using the epitaxial growth process is conducive to increasing the orthographic projection of the initial transition layer 128 on the base 11, making the area of the orthographic projection of a part of the initial transition layer 128 on the base 11 is greater than that of the orthographic projection of the second doped region III on the base 11. The initial transition layer can subsequently be used as a mask to prevent the second dielectric layer surrounding the sidewalls of the second doped regions III from being etched to expose the second doped regions III, so as to ensure a desirable protection effect of the subsequently formed second dielectric layer on the second doped regions III.

Figure 29:
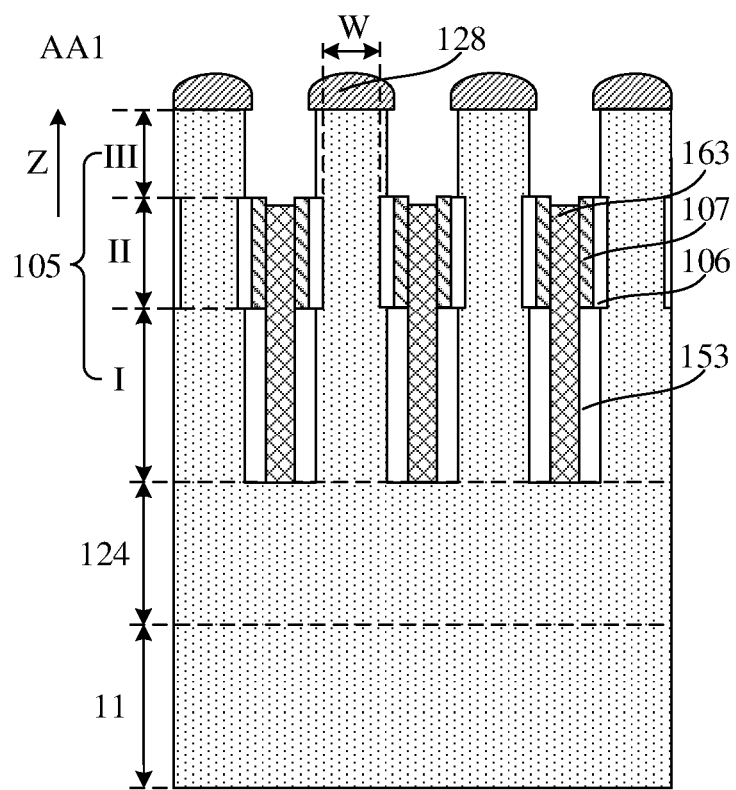

Referring to FIGS. 28 and 29, the first isolation layer 163, the second isolation layer 173 and the third isolation layer 183 are etched by using the initial transition layer 128 as a mask to expose the sidewalls of the second doped regions III. The top surface of the remaining part of the first isolation layer 163 is not higher than the top surface of the word line 107. The orthographic projection of the part of the initial transition layer 128 on the base 11 covers that of the second doped region III on the base 11 to prevent the semiconductor channels 105 from being damaged during etching.

Figure 30:
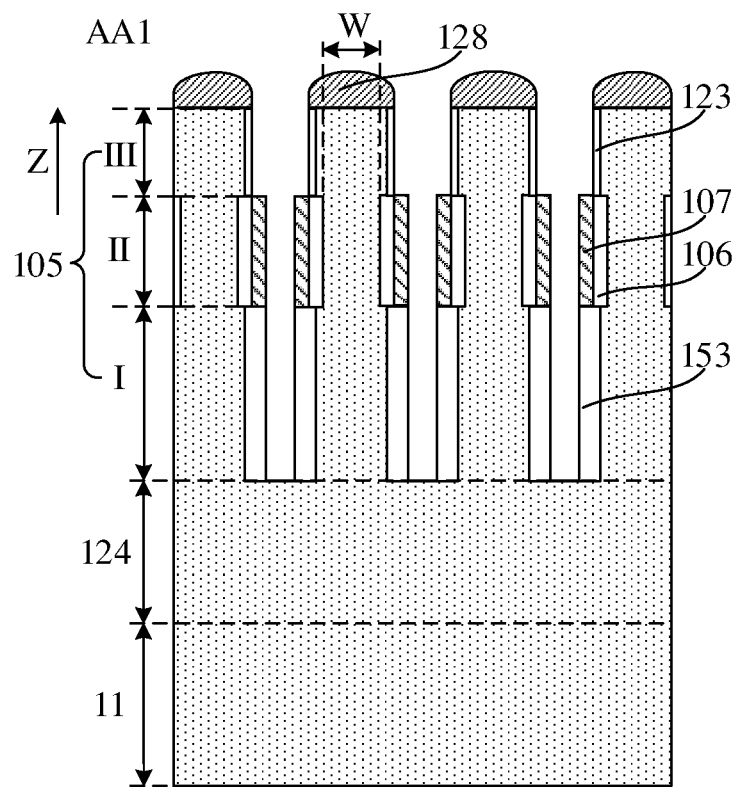

Referring to FIG. 30, a second dielectric film is formed to conformally cover the surface of the initial transition layer 128, the sidewalls of the second doped regions III, the top surfaces of the word lines 107 and the top surface of the first isolation layer 163 (shown in FIG. 29). The second dielectric film is chemically and mechanically flattened until the surface of the initial transition layer 128 is exposed, and the remaining part of the second dielectric layer 123 is etched by using the initial transition layer 128 as a mask. The area of the orthographic projection of the part of the initial transition layer 128 on the base 11 is greater than that of the orthographic projection of the second doped region III on the base 11. Therefore, when a part of the second dielectric film located on the surface of the initial transition layer 128, the top surface of the first isolation layer 163 and partial top surfaces of the word lines 107 is removed, a part of the second dielectric film directly opposite to the orthographic projection of the initial transition layer 128 on the base 11 is prevented from being etched. Thus, the second dielectric layer 123 surrounding the sidewalls of the second doped regions III are formed, and the second dielectric layer 123 has a desirable protection effect on the second doped regions III. The second dielectric film may be formed through a deposition process.

In some embodiments of the present disclosure, referring to FIG. 30, the remaining part of the first isolation layer 163 is removed to expose the top surfaces of the initial bit lines 124.

In other embodiments, the first isolation layer, the second isolation layer and the third isolation layer are etched by using the initial transition layer as a mask to expose the initial bit lines and the sidewalls of the second doped regions. The sidewalls of the second doped regions exposed are thermally oxidized to form the second dielectric layer.

Referring to FIGS. 1 to 4, the initial bit lines 124 exposed and the initial transition layer 128 are metalized, to form the bit lines 104. The material of the bit line 104 includes a metal semiconductor compound 114.

A metal layer is formed on the surface of the initial transition layer 128 and the top surfaces of the initial bit lines 124 to provide a metal element for the subsequently formed bit lines. The metal layer is also located on the exposed parts of surfaces of the second dielectric layer 123, the word lines 107 and the first dielectric layer 113. The material of the metal layer includes at least one of cobalt, nickel, molybdenum, titanium, tungsten, tantalum or platinum.

Annealing is performed to convert a partial thickness of the initial transition layer 128 into a metal contact layer 108 and a partial thickness of the initial bit line 124 (shown in FIG. 30) into a bit line 104.

After the bit lines 104 are formed, the remaining part of the metal layer is removed.

In some embodiments, during annealing, the metal layer reacts with the initial transition layer 128 and the initial bit lines 124. A partial thickness of the initial transition layer 128 is converted into a metal contact layer 108, and a partial thickness of the initial bit line 124 is converted into a bit line 104. In an example, referring to FIG. 2, multiple metal semiconductor compounds 114 in the same bit line 104 are spaced apart from each other. In another example, referring to FIG. 3, multiple metal semiconductor compounds 114 in the same bit line 104 communicate with each other.

In other embodiments, the full thickness of the initial transition layer can be converted into a metal contact layer, and the full thickness of the initial bit line can be converted into a bit line.

In other embodiments, when the initial transition layer is not formed on the top surfaces of the second doped regions, the part of the insulating layer on the top surfaces of the second doped regions is not removed first, and only the initial bit lines are subsequently metalized. After the bit lines are formed, the part of the insulating layer on the top surfaces of the second doped regions is removed. Referring to FIG. 30 and FIGS. 1 to 4, the third dielectric layer 133 is formed. The third dielectric layer 133 fills the first intervals between adjacent parts of the first dielectric layer 113, the second intervals between adjacent word lines 107 and the third intervals between adjacent parts of the second dielectric layer 123 to realize electrical insulation between adjacent semiconductor channels 105 and adjacent word lines 107. In some examples, referring to FIG. 5, when the third dielectric layer 133 is formed, a void may be provided in a part of the third dielectric layer 133 in the second interval.

In other examples, referring to FIGS. 10 to 14 and 31 to 35, the first dielectric layer 113, the insulating layer 106, the word lines 107 and the second dielectric layers 123 are formed as:

Referring to FIGS. 10 to 14, an initial first dielectric layer 113a is formed. The initial first dielectric layer 113a surrounds the sidewalls of the semiconductor channels 105. A fourth interval e is provided between parts of the initial first dielectric layer 113a located on the sidewalls of adjacent semiconductor channels 105 on the same initial bit line 124. A first isolation layer 163 is formed. The first isolation layer 163 fills up the fourth intervals e, and the material of the first isolation layer 163 is different from the material of the initial first dielectric layer 113a.

The forming the initial first dielectric layer 113a and the first isolation layer 163 is the same as the above example, and will not be repeated here.

Figure 31:
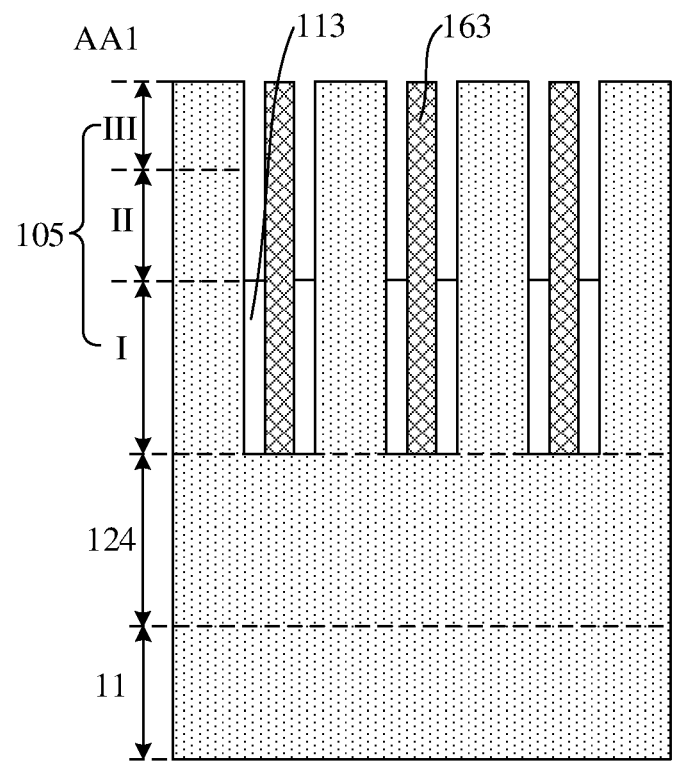

Referring to FIG. 31, the initial first dielectric layer 113a (shown in FIG. 14) is partially etched until exposing the sidewalls of the second doped regions III and the channel regions II, and the remaining part of the initial first dielectric layer 113a is used as the first dielectric layer 113.

Figure 32:
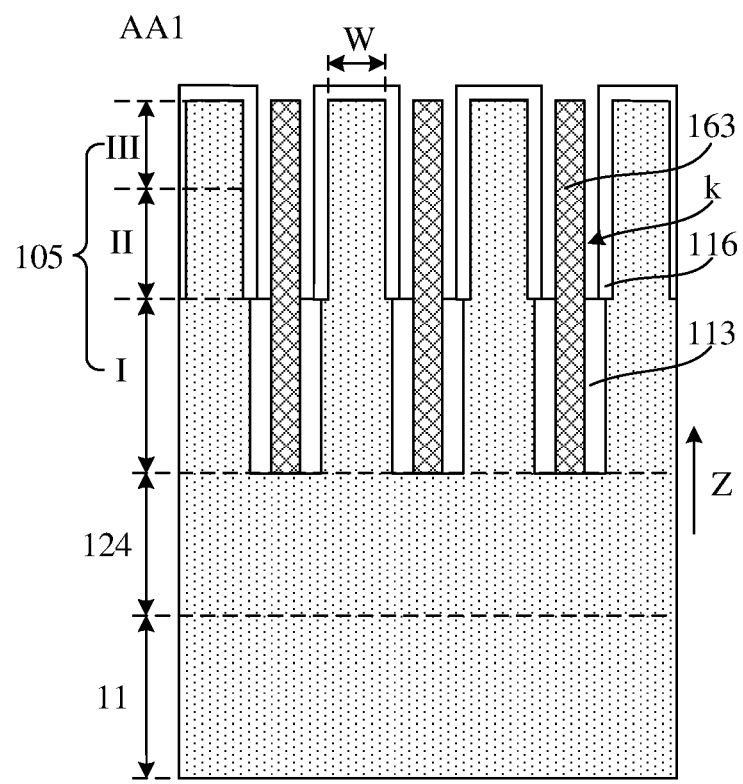
Figure 33:
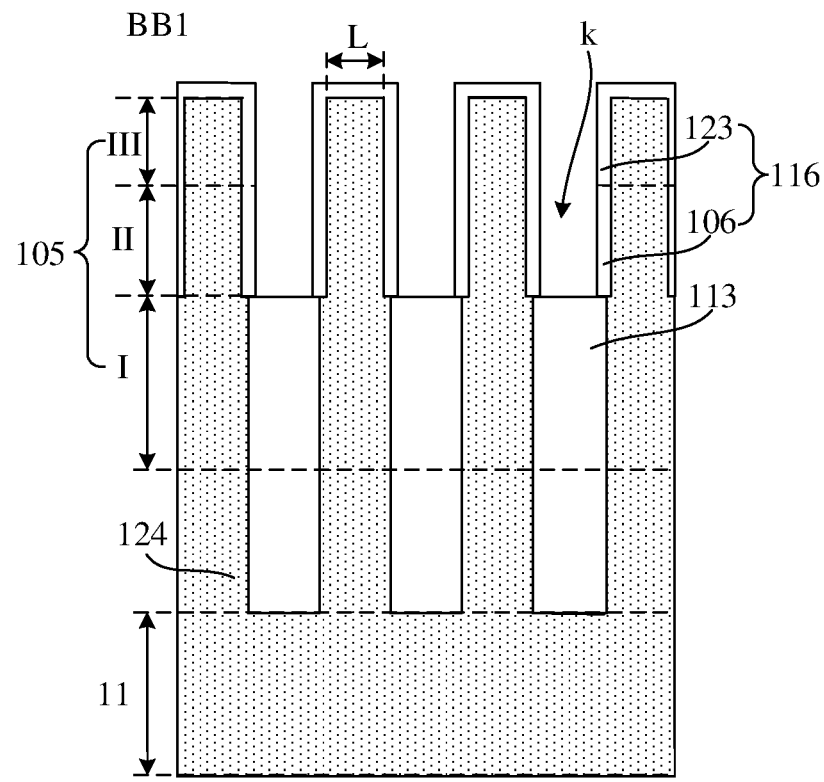

Referring to FIGS. 32 to 33, a protective layer 116 covering the sidewalls of the second doped regions III and the sidewalls of the channel regions II is formed. Sixth intervals k are provided between the protective layer 116 and the first isolation layer 163. The part of the protective layer 116 on the sidewalls of the channel regions II is the insulating layer 106, and the part of the protective layer 116 covering the sidewalls of the second doped regions III is the second dielectric layer 123.

In some embodiments of the present disclosure, referring to FIG. 33, the sixth interval k is also located between the parts of the protective layer 116 on the sidewalls of adjacent semiconductor channels 105 on adjacent initial bit lines 124.

In this embodiment, the material of the semiconductor channel 105 is silicon, and the protective layer 116 is formed as: The sidewalls of the channel regions II and the sidewalls and top surfaces of the second doped regions III exposed are thermally oxidized, such that the protective layer 116 covers the sidewall surfaces of the remaining parts of the channel regions II, the remaining parts of the second doped regions III and the top surfaces of the remaining parts of the second doped regions III. In other embodiments, the protective layer covering the sidewalls of the channel regions and the sidewalls and top surfaces of the second doped regions may also be formed through a deposition process.

By thermally oxidizing the sidewalls of the channel regions II and the second doped regions III exposed, the channel regions II and the second doped regions III are partially converted into the protective layer 116. The orthographic projections of the channel region II and the second doped region III on the base 11 are both smaller than the orthographic projection of the first doped region I on the base 11. Thus, the channel regions II and the second doped regions III can be formed with a smaller sectional area in section perpendicular to the direction Z from the initial bit line 124 to the semiconductor channel 105, without the need for an etching process. In this way, subsequently formed word lines can better control the channel regions II, thereby facilitating the control of the on or off of the GAA transistors.

In this embodiment, the part of the protective layer 116 on the top surfaces of the remaining parts of the second doped regions III is removed in a subsequent process. In other embodiments, the part of the protective layer on the top surfaces of the remaining parts of the second doped regions may be removed after the thermal oxidation, retaining only the part of the protective layer covering the sidewall surfaces of the remaining parts of the channel regions and the remaining parts of the second doped regions.

Figure 34:
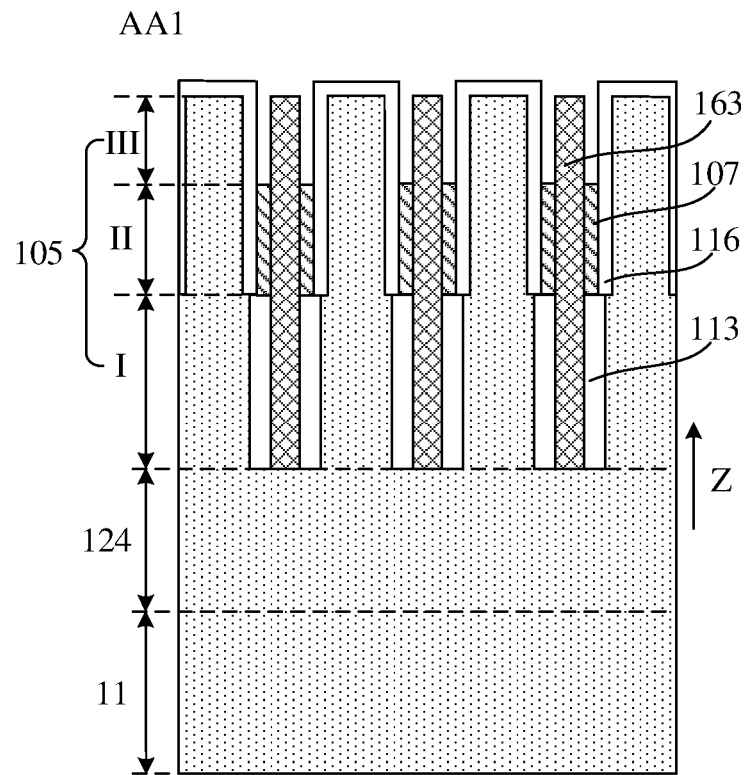
Figure 35:
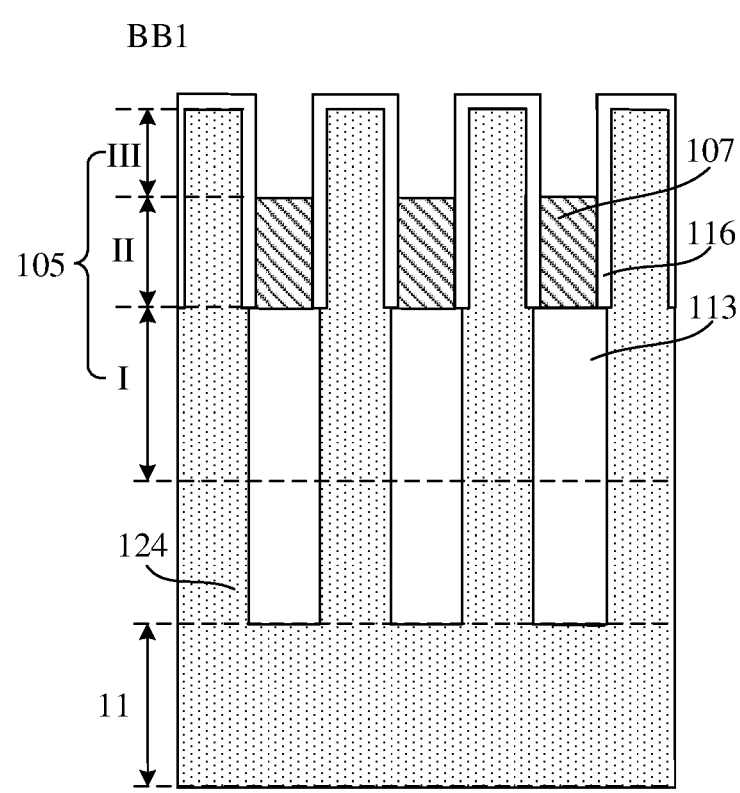

Referring to FIGS. 34 to 35, initial word lines are formed. The initial word lines fill up the sixth intervals k, and the initial word lines are also located between parts of the protective layer 116 on partial sidewalls of the semiconductor channels 105 on adjacent initial bit lines 124. The initial word line is partially removed, and the remaining part of the initial word line is used as the word line 107. The word lines 107 only surround the sidewall of the part of the insulating layer 106 located on the sidewalls of the channel regions II. The initial word lines may be formed through a deposition process, and the material of the initial word line includes at least one of polysilicon, titanium nitride, tantalum nitride, copper or tungsten.

The initial word lines fill up the sixth intervals k in a self-aligned manner, which is conducive to forming the word lines 107 with an accurate size in a self-aligned manner.

After the word lines 107 are formed, forming the third isolation layer, forming the initial transition layer, metalizing the initial transition layer and the initial bit lines to form the metal contact layer and the bit lines, and forming the third dielectric layer are the same as those mentioned in above examples, and will not be repeated here.

In some embodiments of the present disclosure, capacitor structures (not shown in the drawings) are formed on a surface formed by the metal contact layer 108 and the third dielectric layer 133. In other embodiments, the metal contact layer may not be formed. After the part of the insulating layer located on the top surfaces of the second doped regions is removed, the capacitor structures are directly formed on the surface formed by the second doped regions and the third dielectric layer.

In summary, the first dielectric layer 113 and the second dielectric layer 123 are formed, and the first dielectric layer 113 is etched by using the second dielectric layer 123 as a mask to form void structures with a specific shape. The word lines 107 are formed with an accurate size in the void structures in a self-aligned manner through a deposition process. There is no need to design the size of the word line 107 through an etching process, thereby simplifying the forming the word lines 107. In addition, by adjusting the size of the void structure, the small-sized word line 107 can be obtained. In addition, by metalizing the initial bit lines 124 and the initial transition layer 128, the resistance of the finally formed bit lines 104 and the metal contact layer 108 is reduced. Thus, an ohmic contact is formed between the metal contact layer 108 and the capacitor structures to avoid direct contact between the capacitor structures and the semiconductor material to form a Schottky barrier contact. Such a design reduces the contact resistance between the second doped regions III and the capacitor structures and reduces the energy consumption during the operation of the semiconductor structure, thereby improving the electrical performance of the semiconductor structure.

In the description of the specification, the description with reference to terms such as "an embodiment", "an exemplary embodiment", "some implementations", "a schematic implementation" and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

The terms such as "first" and "second" used in the present disclosure may be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

The embodiments of the present disclosure provide a semiconductor structure and a manufacturing method thereof. In the semiconductor structure, vertical GAA transistors are provided on a base, and bit lines are located between the base and the GAA transistors, thereby forming a 3D stacked semiconductor structure, which increases the integration density of the semiconductor structure. In addition, since the bit line is made of a metal semiconductor compound, the resistance of the bit line is reduced to improve the electrical performance of the semiconductor structure.

The invention claimed is:

1. A semiconductor structure, comprising:
   a base;
   bit lines, located on the base, and a material of the bit line comprising a metal semiconductor compound;
   semiconductor channels, located on surfaces of the bit lines, along a direction that the base points to the bit line, the semiconductor channel comprising a first doped region, a channel region and a second doped region arranged in sequence, and the first doped region being in contact with the bit line;
   a first dielectric layer, covering sidewall surfaces of the first doped regions, and a first interval being provided between parts of the first dielectric layer covering sidewalls of adjacent first doped regions on a same bit line;
   an insulating layer, covering sidewall surfaces of the channel regions;
   word lines, covering a sidewall surface of the insulating layer away from the channel regions, and a second interval being provided between adjacent word lines;
   a second dielectric layer, covering sidewall surfaces of the second doped regions, and a third interval being provided between parts of the second dielectric layer located on sidewalls of adjacent second doped regions; and
   a third dielectric layer, located in the first intervals, the second intervals and the third intervals.

2. The semiconductor structure according to claim 1, further comprising: a metal contact layer, located on top surfaces of the second doped regions away from the base, and the metal semiconductor compound and the metal contact layer comprising a same metal element.

3. The semiconductor structure according to claim 2, wherein an orthographic projection of a part of the metal contact layer on the base covers an orthographic projection of the second doped region on the base.

4. The semiconductor structure according to claim 2, further comprising: a transition layer, located between the second doped regions and the metal contact layer, and the metal contact layer wrapping the transition layer, the transition layer and the second doped region being doped with a same type of a doped ion, a doping concentration of the doped ion in the transition layer being greater than a doping concentration of the doped ion in the second doped region, and the doped ion being one of N-type ion or P-type ion.

5. The semiconductor structure according to claim 1, wherein the base, the bit line and the semiconductor channel comprise a same semiconductor element.

6. The semiconductor structure according to claim 1, wherein the first doped region, the channel region and the second doped region are doped with a same type of a doped ion, a doping concentration of the doped ion in the first doped region is the same as a doping concentration of the doped ion in the channel region and a doping concentration of the doped ion in the second doped region, and the doped ion is one of N-type ion or P-type ion.

7. The semiconductor structure according to claim 1, wherein an orthographic projection of the channel region on the base is smaller than an orthographic projection of the second doped region on the base, and is smaller than an orthographic projection of the first doped region on the base.

8. The semiconductor structure according to claim 1, wherein the insulating layer and the second dielectric layer are a same film structure.

9. The semiconductor structure according to claim 1, wherein an orthographic projection of a periphery of the insulating layer on the base is smaller than an orthographic projection of a periphery of the second dielectric layer on the base.

10. The semiconductor structure according to claim 1, wherein the first dielectric layer comprises a fourth dielectric layer and a fifth dielectric layer; the fourth dielectric layer is located in intervals between adjacent bit lines, and is located in intervals between adjacent first doped regions on adjacent bit lines; and the fifth dielectric layer is located on the sidewalls of the adjacent first doped regions on the same bit line and a sidewall of the fourth dielectric layer.

11. The semiconductor structure according to claim 1, wherein a part of the third dielectric layer located in the second intervals comprises voids.

* * * * *